(12) United States Patent
Shimokawa

(10) Patent No.: US 10,461,584 B2
(45) Date of Patent: Oct. 29, 2019

(54) POWER RECEIVER AND POWER TRANSMITTING SYSTEM

(71) Applicant: FUJITSU LIMITED, Kawasaki-shi, Kanagawa (JP)

(72) Inventor: Satoshi Shimokawa, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 169 days.

(21) Appl. No.: 15/677,446

(22) Filed: Aug. 15, 2017

(65) Prior Publication Data
US 2017/0346346 A1 Nov. 30, 2017

Related U.S. Application Data

(63) Continuation of application No. PCT/JP2015/054891, filed on Feb. 20, 2015.

(51) Int. Cl.
*H02J 7/02* (2016.01)
*H02J 50/12* (2016.01)
(Continued)

(52) U.S. Cl.
CPC .............. *H02J 50/12* (2016.02); *H01F 38/14* (2013.01); *H02J 7/025* (2013.01); *H02J 50/40* (2016.02); *H02J 50/80* (2016.02); *H03L 7/085* (2013.01)

(58) Field of Classification Search
CPC .. H02J 50/80; H02J 50/12; H02J 7/025; H02J 50/40; H03L 7/085; H01F 38/14
See application file for complete search history.

(56) References Cited

U.S. PATENT DOCUMENTS

| 5,450,305 A | 9/1995 | Boys | |
|---|---|---|---|
| 2008/0164876 A1* | 7/2008 | Sakakura | G01R 33/385 324/318 |

(Continued)

FOREIGN PATENT DOCUMENTS

| JP | 3178837 B2 | 6/2001 |
|---|---|---|
| JP | 2011-019291 A1 | 1/2011 |

(Continued)

OTHER PUBLICATIONS

Extended European Search Report for counterpart EPC Patent Application No. 14905373.8 dated Sep. 20, 2017 (14 Sheets).

(Continued)

*Primary Examiner* — Alfonso Perez Borroto
*Assistant Examiner* — Esayas G Yeshaw
(74) *Attorney, Agent, or Firm* — Kratz, Quintos & Hanson, LLP

(57) ABSTRACT

A power receiver includes: a secondary-side resonant coil including a resonant coil part to receive electric power from a primary-side resonant coil through magnetic field resonance; a first capacitor inserted in series in the resonant coil part; a series circuit of a first switch and a second switch; a first rectifier having a first rectification direction; a second rectifier having a second rectification direction opposite to the first rectification direction; a second capacitor inserted in series with the series circuit; a detector configured to detect a voltage waveform or a current waveform of the electric power; and a controller configured to adjust a phase difference between the waveform and a driving signal that includes a first signal for switching on/off the first switch and a second signal for switching on/off the second switch to adjust an amount of the electric power received by the secondary-side resonant coil.

12 Claims, 25 Drawing Sheets

(51) Int. Cl.
    *H02J 50/80*     (2016.01)
    *H02J 50/40*     (2016.01)
    *H01F 38/14*     (2006.01)
    *H03L 7/085*     (2006.01)

(56) References Cited

U.S. PATENT DOCUMENTS

| | | | |
|---|---|---|---|
| 2008/0303479 A1* | 12/2008 | Park | H02J 7/025 320/108 |
| 2011/0006612 A1* | 1/2011 | Kozakai | H02J 50/80 307/104 |
| 2011/0053500 A1 | 3/2011 | Menegoli | |
| 2011/0221277 A1 | 9/2011 | Boys | |
| 2012/0032632 A1* | 2/2012 | Soar | H01F 38/14 320/108 |
| 2012/0217111 A1 | 8/2012 | Boys | |
| 2014/0035379 A1* | 2/2014 | Stevens | H02J 7/0013 307/104 |
| 2014/0035382 A1 | 2/2014 | Covic | |
| 2014/0143933 A1* | 5/2014 | Low | G04C 10/00 2/170 |
| 2014/0312702 A1* | 10/2014 | Uchida | H02J 17/00 307/80 |
| 2015/0224883 A1* | 8/2015 | Ichikawa | B60L 50/40 320/108 |
| 2015/0326028 A1* | 11/2015 | Suzuki | H02J 7/025 307/104 |
| 2016/0118836 A1* | 4/2016 | Waldschmidt | H02J 7/025 320/108 |
| 2017/0133880 A1* | 5/2017 | Wakisaka | H02J 50/80 |
| 2018/0062430 A1* | 3/2018 | Matsumoto | H02J 7/00 |

FOREIGN PATENT DOCUMENTS

| | | |
|---|---|---|
| JP | 2011-151989 A1 | 8/2011 |
| JP | 2011-239655 A1 | 11/2011 |
| JP | 2012-502618 A1 | 1/2012 |
| JP | 2012-039707 A1 | 2/2012 |
| JP | 2012-253964 A1 | 12/2012 |
| JP | 2013-504298 A1 | 2/2013 |
| JP | 2014-023324 A1 | 2/2014 |
| JP | 2014-143776 A1 | 8/2014 |
| WO | 9304527 A1 | 3/1993 |
| WO | 2014007656 A1 | 1/2014 |

OTHER PUBLICATIONS

Korean Office Action for corresponding Kr Patent Application No. 10-2017-7011781, dated Jun. 12, 2018 (16 Sheets).
S. Shimokawa, et al.; "Efficiency Control by Using Switching Devices for Resonant-Type Wireless Power Transfer;" (1 Sheet, 3 Sheets translation, 4 Sheets total).
International Search Report for International Application No. PCT/JP2015/054891 dated Apr. 28, 2015 (Present Case).
International Search Report for International Application No. PCT/JP2014/079471 dated Jan. 6, 2015 (Related Case).
International Search Report for International Application No. PCT/JP2015/054892 dated Apr. 28, 2015 (Related Case).

* cited by examiner

TRANSMITTED ELECTRIC POWER 18.75 W

TRANSMITTED ELECTRIC POWER 12.5 W

FIG.14A

| $M_{TB}$ \ $M_{TA}$ | $M_{TA1}$ | $M_{TA2}$ | $M_{TA3}$ | . . . |
|---|---|---|---|---|
| $M_{TB1}$ | PD1A | PD2A | PD3A | |
| $M_{TB2}$ | PD11A | PD12A | PD13A | |
| ⋮ | | | | |

FIG.14B

| $M_{TB}$ \ $M_{TA}$ | $M_{TA1}$ | $M_{TA2}$ | $M_{TA3}$ | . . . |
|---|---|---|---|---|
| $M_{TB1}$ | PD1B | PD2B | PD3B | |
| $M_{TB2}$ | PD11B | PD12B | PD13B | |
| ⋮ | | | | |

FIG.15A

| $M_{TA1}$ | $E_{A1}$ |
|---|---|
| $M_{TA2}$ | $E_{A2}$ |
| ⋮ | ⋮ |

FIG.15B

| $M_{TB1}$ | $E_{B1}$ |
|---|---|
| $M_{TB2}$ | $E_{B2}$ |
| ⋮ | ⋮ |

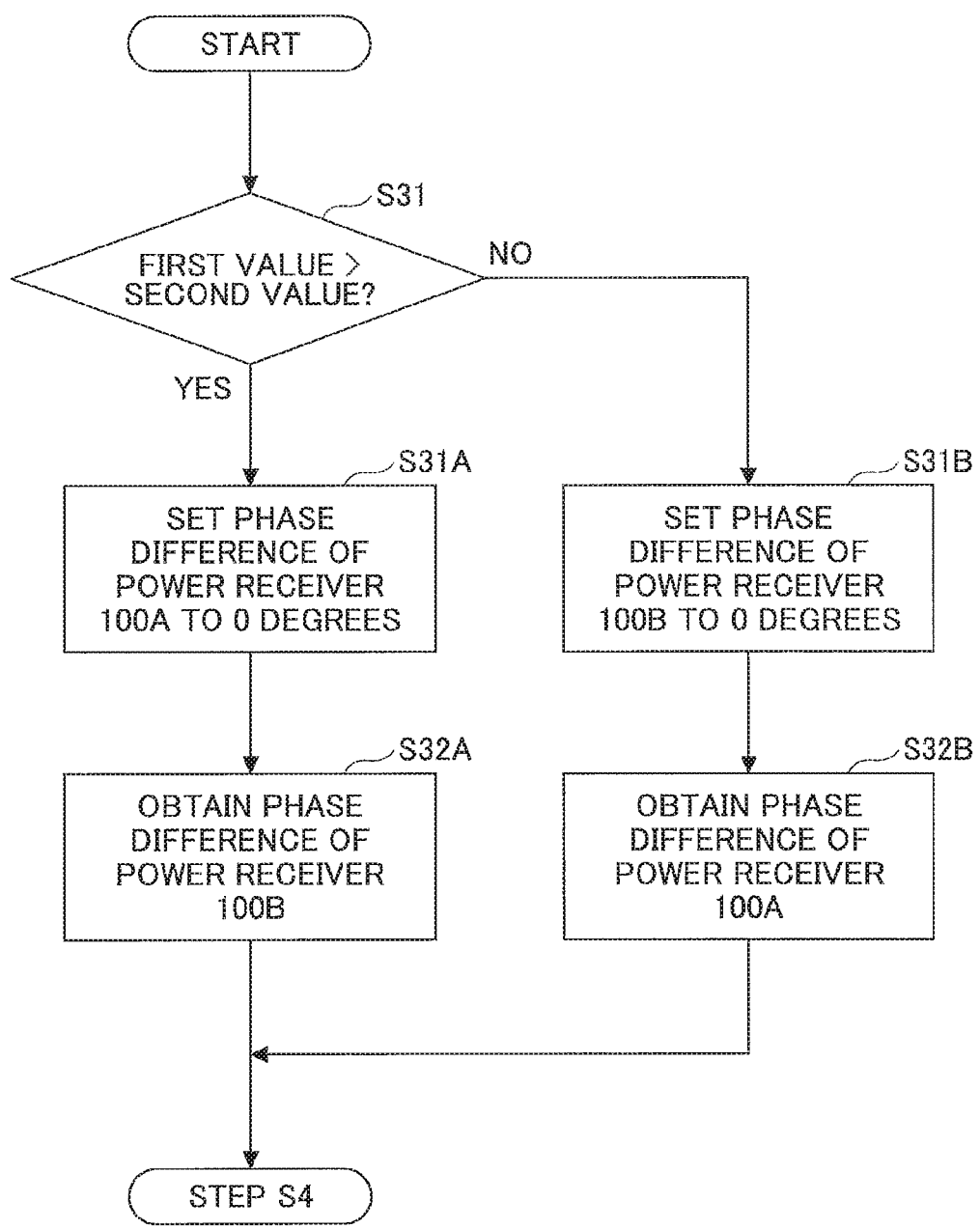

| COMBINATION OF Y1 TO YN | | | | COMBINATION OF PD1 TO PDN | | | |
|---|---|---|---|---|---|---|---|
| Ya1 | Ya2 | ... | YaN | PDa1 | PDa2 | ... | PDaN |
| Yb1 | Yb2 | ... | YbN | PDb1 | PDb2 | ... | PDbN |
| | | ... | | | | ... | |

POWER RECEIVER AND POWER TRANSMITTING SYSTEM

CROSS-REFERENCE TO RELATED APPLICATION

This application is a continuation application of International Application PCT/JP2015/054891 filed on Feb. 20, 2015 and designated the U.S., the entire contents of which are incorporated herein by reference.

FIELD

The embodiments discussed herein relate to a power receiver and a power transmitting system.

BACKGROUND

Conventionally, there exists a contactless power receiving apparatus including: a resonance element adapted to receive supply of alternating-current power in a contactless fashion by resonance from a resonance element of a power supplying source; an excitation element adapted to receive supply of the alternating-current power by electromagnetic induction from the resonance element; a rectification circuit adapted to generate direct-current power from the alternating-current power from the excitation element and output the direct-current power; and a changeover circuit adapted to change over the alternating-current power to the rectification circuit between a supply state and a non-supply state (see Patent Document 1, for example).

Such a conventional contactless power receiving apparatus (power receiver) does not take into consideration efficiency of electric power reception when the resonance element receives the electric power transmitted to the power receiver. If the efficiency of electric power reception can be adjusted, it is possible to transmit electric power efficiently between the power transmitter and the power receiver.

RELATED-ART DOCUMENTS

Patent Documents

[Patent Document 1] Japanese Laid-open Patent Publication No. 2011-019291

SUMMARY

According to an aspect of the embodiments, a power receiver includes: a secondary-side resonant coil including a resonant coil part and configured to receive electric power from a primary-side resonant coil through magnetic field resonance generated between the primary-side resonant coil and the secondary-side resonant coil; a first capacitor inserted in series in the resonant coil part of the secondary-side resonant coil; a series circuit, coupled in parallel with the first capacitor, of a first switch and a second switch; a first rectifier coupled in parallel with the first switch, the first rectifier having a first rectification direction; a second rectifier coupled in parallel with the second switch, the second rectifier having a second rectification direction opposite to the first rectification direction; a second capacitor inserted in series with the series circuit; a detector configured to detect a voltage waveform or a current waveform of the electric power supplied to the secondary-side resonant coil; and a controller configured to adjust a phase difference between the voltage waveform or the current waveform detected by the detector and a driving signal that includes a first signal for switching on/off the first switch and includes a second signal for switching on/off the second switch to adjust an amount of the electric power received by the secondary-side resonant coil.

The object and advantages of the invention will be realized and attained by means of the elements and combinations particularly pointed out in the claims. It is to be understood that both the foregoing general description and the following detailed description are exemplary and explanatory and are not restrictive of the invention.

BRIEF DESCRIPTION OF DRAWINGS

FIGS. 14A and 14B are diagrams illustrating table data that associates phase differences with relationships between mutual inductances $M_{TA}$ and mutual inductances $M_{TB}$;

FIGS. 15A and 15B are diagrams illustrating table data that associate efficiencies of electric power reception with mutual inductances $M_{TA}$ and $M_{TB}$;

FIG. 16 is a flowchart illustrating a method in which the power transmitter 10 sets the phase difference of the power receiver 100A or 100B according to the first embodiment;

FIG. 19 is a diagram illustrating current paths in the capacitor 115 and the adjuster 130V;

FIG. 26 is a diagram illustrating tabular data used in the third embodiment;

DESCRIPTION OF EMBODIMENT

Hereinafter, embodiments, to which power receivers and a power transmitting system of the present invention are applied, will be described. An object is to provide a power receiver and a power transmitting system that can adjust efficiency of electric power reception.

First Embodiment

Before describing a first embodiment to which power receivers and a power transmitting system of the present invention are applied, a technical premise of the power transmitting system and the power receivers according to the first embodiment is described with reference to FIGS. 1 to 3.

Figure 1:
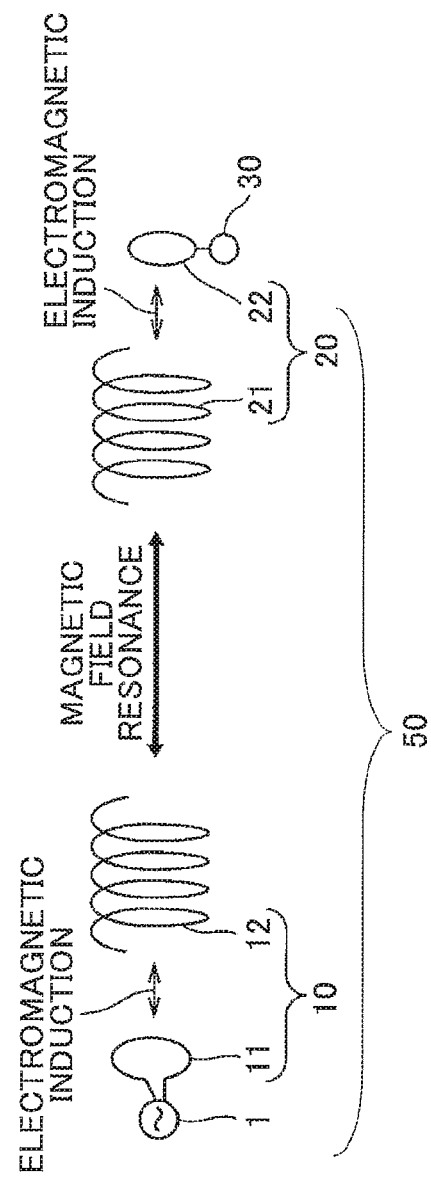
FIG. 1 is a diagram illustrating a power transmitting system 50.

FIG. 1 is a diagram illustrating a power transmitting system 50.

As illustrated in FIG. 1, the power transmitting system 50 includes an alternating-current (AC) power source 1, a primary-side (power transmitting side) power transmitter 10, and a secondary-side (power receiving side) power receiver 20. The power transmitting system 50 may include a plurality of power transmitters 10 and a plurality of power receivers 20.

The power transmitter 10 includes a primary-side coil 11 and a primary-side resonant coil 12. The power receiver 20 includes a secondary-side resonant coil 21 and a secondary-side coil 22. A load device 30 is coupled to the secondary-side coil 22.

As illustrated in FIG. 1, the power transmitter 10 and the power receiver 20 perform transmission of energy (electric power) from the power transmitter 10 to the power receiver 20 through magnetic-field resonance (magnetic-field sympathetic vibration) between the primary-side resonant coil (LC resonator) 12 and the power receiving resonant coil (LC resonator) 21. Here, the electric power can be transmitted from the primary-side resonant coil 12 to the secondary-side resonant coil 21 by not only the magnetic-field resonance but also by electric field resonance (electric field sympathetic vibration) or the like. In the following description, the magnetic-field resonance will be mainly described as an example.

In the first embodiment, for example, a case is described where a frequency of an AC voltage that the AC power source 1 outputs is 6.78 MHz and a resonance frequency of the primary-side resonant coil 12 and the secondary-side resonant coil 21 is 6.78 MHz.

Note that the electric power transmission from the primary-side coil 11 to the primary-side resonant coil 12 is performed by utilizing electromagnetic induction. Also, the electric power transmission from the secondary-side resonant coil 21 to the secondary-side coil 22 is performed by utilizing electromagnetic induction.

Although FIG. 1 illustrates a configuration in which the power transmitting system 50 includes the secondary-side coil 22, the power transmitting system 50 is not required to include the secondary-side coil 22. In this case, the load device 30 may be directly coupled to the secondary-side resonant coil 21.

Figure 2:
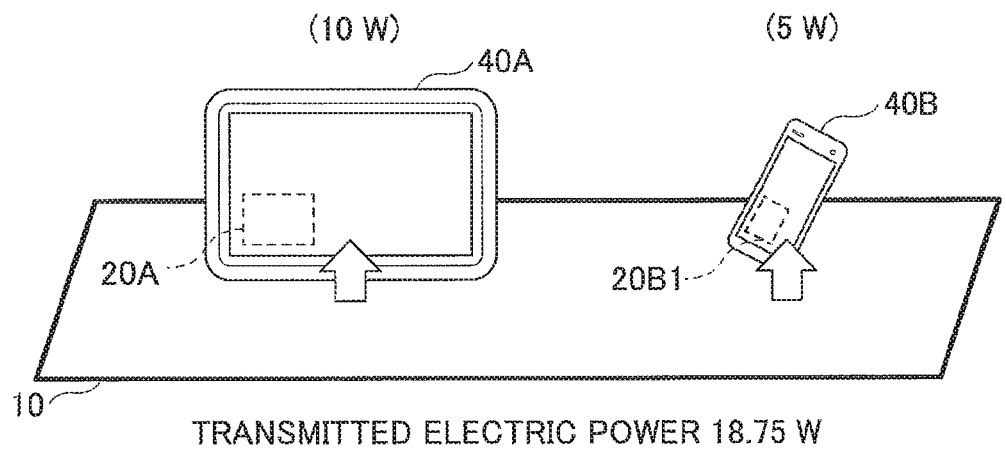
FIG. 2 is a diagram illustrating a state in which electric power is transmitted from a power transmitter 10 to electronic devices 40A and 40B through magnetic-field resonance.

FIG. 2 is a diagram illustrating a state where electric power is transmitted from the power transmitter 10 to electronic devices 40A and 40B through magnetic-field resonance.

The electronic devices 40A and 40B are a tablet computer and a smartphone, respectively, and include power receivers 20A and 20B, respectively. Each of the power receivers 20A and 20B has a configuration where the secondary-side coil 22 is removed from the power receiver 20 (see FIG. 1) illustrated in FIG. 1. That is, each of the power receivers 20A and 20B includes the secondary-side resonant coil 21. Note that although the simplified power transmitter 10 is illustrated in FIG. 2, the power transmitter 10 is coupled to the AC power source 1 (see FIG. 1).

In FIG. 2, each of the electronic devices 40A and 40B is arranged at an equal distance from the power transmitter 10. The power receivers 20A and 20B included in the respective electronic devices 40A and 40B simultaneously receive the electric power from the power transmitter 10 through the magnetic-field resonance in a non-contact state.

Here, for example, in a state illustrated in FIG. 2, an efficiency of electric power reception of the power receiver 20A included in the electronic device 40A is 40%, and an efficiency of electric power reception of the power receiver 20B included in the electronic device 40B is 40%.

The respective efficiencies of electric power reception of the power receivers 20A and 20B are expressed as ratios of electric power received by the secondary-side coils 22 of the power receivers 20A and 20B, with respect to electric power transmitted from the primary-side coil 11 coupled to the AC power source 1. Note that in a case where the primary-side resonant coil 12 is directly coupled to the AC power source 1 and the power transmitter 10 does not include the primary-side coil 11, the received electric power may be calculated by using electric power transmitted from the primary-side resonant coil 12 instead of using the electric power transmitted from the primary-side coil 11. In a case where the power receivers 20A and 20B do not include the secondary-side coil 22, received electric power may be calculated by using electric power received by the secondary-side resonant coil 21 instead of using the electric power received by the secondary-side coil 22.

The efficiency of electric power reception of the power receiver 20A and the efficiency of electric power reception of the power receiver 20B are determined depending on specifications of the coils of the power receivers 20A and 20B and of the power transmitter 10 and on distances/orientations between the power transmitter 10 and the respective power receivers 20A and 20B. In FIG. 2, because the power receivers 20A and 20B have the same configuration and are arranged at positions of equal distance/orientation from the power transmitter 10, the efficiency of electric power reception of the power receiver 20A and the efficiency of electric power reception of the power receiver 20B are equal to each other and, as an example, at 40%.

Further, a rated output of the electronic device 40A is taken as 10 W and a rated output of the electronic device 40B is taken as 5 W.

In such a case, electric power transmitted from the primary-side resonant coil 12 (see FIG. 1) of the power transmitter 10 is 18.75 W. Here, 18. 75 W can be calculated by a formula of (10 W+5 W)/(40%+40%).

When electric power of 18.75 W is transmitted to the electronic devices 40A and 40B from the power transmitter 10, the power receivers 20A and 20B receive electric power of 15 W in total. Because the power receivers 20A and 20B equally receive the electric power, each of the power receivers 20A and 20B receives electric power of 7.5 W.

As a result, electric power to the electronic device 40A is insufficient by 2.5 W, and electric power to the electronic device 40B is excessive by 2.5 W.

That is, even when electric power of 18.75 W is transmitted from the power transmitter 10 to the electronic devices 40A and 40B, the electronic devices 40A and 40B cannot receive the electric power in a balanced manner. In other words, when the electronic devices 40A and 40B simultaneously receive electric power, the supply balance of electric power is not good.

Figure 3:
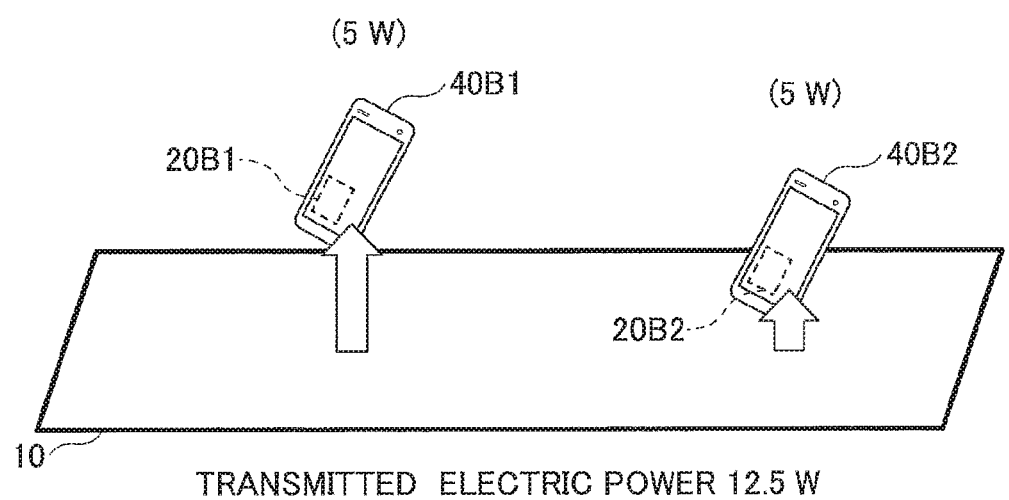
FIG. 3 is a diagram illustrating a state in which electric power is transmitted from the power transmitter 10 to electronic devices 40B1 and 40B2 through magnetic-field resonance.

FIG. 3 is a diagram illustrating a state where electric power is transmitted from the power transmitter 10 to electronic devices 40B1 and 40B2 through magnetic-field resonance.

The electronic devices 40B1 and 40B2 are the same type of smartphone and respectively include power receivers 20B1 and 20B2. Each of the power receivers 20B1 and 20B2 is equal to the power receiver 20B illustrated in FIG. 2. That is, each of the power receivers 20B1 and 20B2 includes the secondary-side resonant coil 21. Although a simplified power transmitter 10 is illustrated in FIG. 3, the power transmitter 10 is coupled to the AC power source 1 (see FIG. 1).

In FIG. 3, an angle (orientation) of the electronic device 40B1 with respect to the power transmitter 10 is equal to an angle (orientation) of the electronic device 40B2 with respect to the power transmitter 10. However, the electronic device 40B1 is arranged further away from the power transmitter 10 than the electronic device 40B2. The power receivers 20B1 and 20B2 included in the respective electronic devices 40B1 and 40B2 simultaneously receive electric power from the power transmitter 10 through the magnetic field resonance in a non-contact state.

For example, in the state illustrated in FIG. 3, an efficiency of electric power reception of the power receiver 20B1 included in the electronic device 40B1 is 35%, and an efficiency of electric power reception of the power receiver 20B2 included in the electronic device 40B2 is 45%.

Here, because the angle (orientation) of the electronic device 40B1 with respect to the power transmitter 10 and the angle (orientation) of the electronic device 40B2 with respect to the power transmitter 10 are equal to each other, the efficiency of electric power reception of the power receiver 20B1 and the efficiency of electric power reception of the power receiver 20B2 are determined depending on distances between the power transmitter 10 and the respective power receivers 20B1 and 20B2. Thus, in FIG. 3, the efficiency of electric power reception of the power receiver 20B1 is lower than the efficiency of electric power reception of the power receiver 20B2. Note that both the rated output of the electronic device 40B1 and the rated output of the electronic device 40B2 are 5 W.

In such a case, electric power transmitted from the primary-side resonant coil 12 (see FIG. 1) of the power transmitter 10 is 12.5 W. Here, 12. 5 W can be calculated by a formula of (5 W+5 W)/(35%+45%).

When electric power of 12.5 W is transmitted to the electronic devices 40B1 and 40B2 from the power transmitter 10, the power receivers 20B1 and 20B2 receive electric power of 10 W in total. Further, because the efficiency of electric power reception of the power receiver 20B1 is 35%, and the efficiency of electric power reception of the power receiver 20B2 is 45% in FIG. 3, the power receiver 20B1 receives electric power of about 4.4 W and the power receiver 20B2 receives electric power of about 5.6 W.

As a result, electric power to the electronic device 40B1 is insufficient by about 0.6 W, and electric power to the electronic device 40B2 is excessive by about 0.6 W.

That is, even when electric power of 12.5 W is transmitted from the power transmitter 10 to the electronic devices 40B1 and 40B2, the electronic devices 40B1 and 40B2 cannot receive electric power in a balanced manner. In other words, when the electronic devices 40B1 and 40B2 simultaneously receive electric power, the supply balance of electric power is not good (has scope for improvement).

Here, in the above description of the supply balance of electric power, the angles (orientations) of the electronic devices 40B1 and 40B2 with respect to the power transmitter 10 are the same and the distances from the power transmitter 10 to the electronic devices 40B1 and 40B2 are different.

However, because the efficiencies of electric power reception are determined depending on the angles (orientations) and the distances between the power receivers 20B1 and 20B2 and the power transmitter 10, the efficiency of electric power reception of the power receiver 20B1 and the efficiency of electric power reception of the power receiver 20B2 become values different from the above described 35% and 45% when angles (orientations) of the electronic devices 40B1 and 40B2 are different from a positional relationship illustrated in FIG. 3.

The efficiency of electric power reception of the power receiver 20B1 and the efficiency of electric power reception of the power receiver 20B2 become different values from each other when angles (orientations) of the electronic devices 40B1 and 40B2, with respect to the power transmitter 10, are different even if the distances from the power transmitter 10 to the electronic devices 40B1 and 40B2 are equal to each other.

As described above, as illustrated in FIG. 2, when simultaneously transmitting electric power through magnetic field resonance from the power transmitter 10 to the electronic devices 40A and 40B of which rated outputs are different from each other, it is difficult for the electronic devices 40A and 40B to receive electric power in a balanced manner.

Also, as illustrated in FIG. 3, the efficiency of electric power reception of the power receiver 20B1 and the efficiency of electric power reception of the power receiver 20B2 are different from each other when angles (orientations) of the electronic devices 40B1 and 40B2, with respect to the power transmitter 10, are different even if the rated outputs of the electronic devices 40B1 and 40B2 are equal to each other. Therefore, it is difficult for the electronic devices 40A and 40B to receive electric power in a balanced manner.

Also, in the descriptions of the respective cases of FIG. 2 and FIG. 3, the electronic devices 40A and 40B and the electronic devices 40B1 and 40B2 receive the electric power at the same time. However, it is considered that a plurality of electronic devices such as the electronic devices 40A and 40B or the electronic devices 40B1 and 40B2 may separately receive electric power in a time-division manner.

However, in a case where a plurality of electronic devices receives electric power at different timings in a time sharing manner, a problem occurs with the time taken for all the electronic devices to completely receive the electric power, because other power receivers cannot receive electric power during the time each power receiver is receiving electric power.

Next, a power transmitting system and a power receiver according to the first embodiment will be described with reference to FIG. 4 and FIG. 10.

Figure 4:
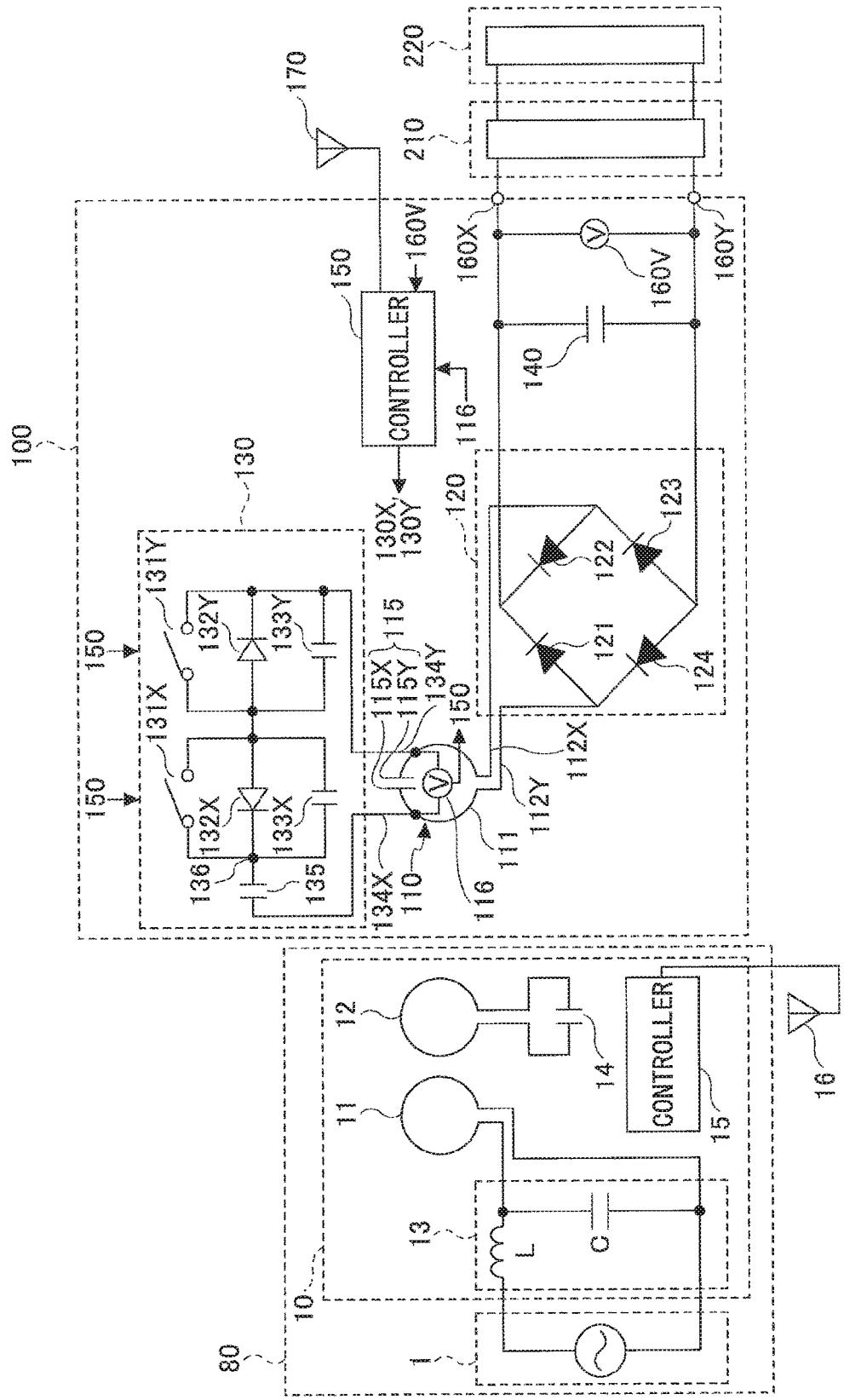
FIG. 4 is a diagram illustrating a power transmitting apparatus 80 and a power receiver 100 according to a first embodiment.

FIG. 4 is a diagram illustrating a power transmitting apparatus 80 and the power receiver 100 according to the first embodiment. The power transmitting apparatus 80 includes an alternating-current (AC) power source 1 and a power transmitter 10. Although the AC power source 1 and the power transmitter 10 are equivalent to those illustrated in FIG. 1, FIG. 4 illustrates a more specific configuration.

The power transmitting apparatus 80 includes the AC power source 1 and the power transmitter 10.

The power transmitter 10 includes a primary-side coil 11, a primary-side resonant coil 12, a matching circuit 13, a capacitor 14, a controller 15, and an antenna 16.

The power receiver 100 includes a secondary-side resonant coil 110, a capacitor 115, a voltmeter 116, a rectifier circuit 120, an adjuster 130, a smoothing capacitor 140, a controller 150, a voltmeter 160V, output terminals 160X and 160Y, and an antenna 170. A DC-DC converter 210 is coupled to the output terminals 160X and 160Y, and a battery 220 is coupled to an output side of the DC-DC converter 210.

First, the power transmitter 10 will be described. As illustrated in FIG. 4, the primary-side coil 11 is a loop-shaped coil, and is coupled to the AC power source 1 via the matching circuit 13 between two ends of the primary-side coil 11. The primary-side coil 11 is disposed close to but not in contact with the primary-side resonant coil 12. The primary-side coil 11 is electromagnetically coupled to the primary-side resonant coil 12. The primary-side coil 11 is disposed such that the central axis of the primary-side coil 11 matches the central axis of the primary-side resonant coil 12. The central axis of the primary-side coil 11 and the central axis of the primary-side resonant coil 12 are made to match each other in order to inhibit leakage of magnetic flux and to inhibit unnecessary generation of magnetic fields around the primary-side coil 11 and the primary-side resonant coil 12, as well as improving the coupling strength between the primary-side coil 11 and the primary-side resonant coil 12.

The primary-side coil 11 generates magnetic fields by alternating-current (AC) power supplied from the AC power source 1 via the matching circuit 13, and transmits the electric power to the primary-side resonant coil 12 by electromagnetic induction (mutual induction).

As illustrated in FIG. 4, the primary-side resonant coil 12 is disposed close to but not in contact with the primary-side coil 11. The primary-side resonant coil 12 is electromagnetically coupled to the primary-side coil 11. Further, the primary-side resonant coil 12 has a predetermined resonance frequency and is designed to have a very high Q factor. The resonance frequency of the primary-side resonant coil 12 is set to be equal to the resonance frequency of the secondary-side resonant coil 110. The capacitor 14 for adjusting the resonance frequency is coupled in series between the two ends of the primary-side resonant coil 12.

The resonance frequency of the primary-side resonant coil 12 is set to be equal to the frequency of the AC power that the AC power source 1 outputs. The resonance frequency of the primary-side resonant coil 12 is determined depending on an electrostatic capacitance of the capacitor 14 and an inductance of the primary-side resonant coil 12. Hence, the electrostatic capacitance of the capacitor 14 and the inductance of the primary-side resonant coil 12 are set such that the resonance frequency of the primary-side resonant coil 12 is equal to the frequency of the AC power output from the AC power source 1.

The matching circuit 13 is inserted for matching impedance between the primary-side coil 11 and that of the AC power source 1, and includes an inductor L and a capacitor C.

The AC power source 1 is a power source that outputs AC power having a frequency necessary for the magnetic field resonance, and includes an amplifier that amplifies the output power. The AC power source 1 may, for example, output high frequency AC power from several hundreds of kHz to several tens of MHz.

The capacitor 14 is a variable capacitance capacitor inserted in series between the two ends of the primary-side resonant coil 12. The capacitor 14 is disposed for adjusting the resonance frequency of the primary-side resonant coil 12. The electrostatic capacitance of the capacitor 14 is set by the controller 15.

The controller 15 controls the output frequency and the output voltage of the AC power source 1 and controls the electrostatic capacitance of the capacitor 14. Also, the controller 15 executes data communication with the power receiver 100 through the antenna 16.

The power transmitting apparatus 80 as described above transmits, to the primary-side resonant coil 12 through magnetic induction, the AC power supplied from the AC power source 1 to the primary-side coil 11, and transmits the electric power from the primary-side resonant coil 12 to the secondary-side resonant coil 110 of the power receiver 100 through magnetic field resonance.

Next, the secondary-side resonant coil 110 included in the power receiver 100 will be described. Here, in the description of the embodiment, the resonance frequency is 6.78 MHz, for example.

The secondary-side resonant coil 110 has a resonance frequency equal to that of the primary-side resonant coil 12, and is designed to have a very high Q factor. The secondary-side resonant coil 110 includes a resonant coil part 111, and terminals 112X and 112Y. Here, although the resonant coil part 111 is substantially equivalent to the secondary-side resonant coil 110, a configuration, in which the terminals 112X and the 112Y are provided on both ends of the resonant coil part 111, is treated as the secondary-side resonant coil 110.

In the resonant coil part 111, the capacitor 115 for adjusting the resonance frequency is inserted in series. Further, the adjuster 130 is coupled in parallel with the capacitor 115. Further, the terminals 112X and 112Y are provided on both ends of the resonant coil part 111. The terminals 112X and 112Y are coupled to the rectifier circuit 120. The terminals 112X and 112Y are examples of a first terminal and a second terminal, respectively.

The secondary-side resonant coil 110 is coupled to the rectifier circuit 120 without introducing a secondary-side coil. In a state where resonance generation is enabled by the adjuster 130, the secondary-side resonant coil 110 outputs, to the rectifier circuit 120, the AC power transmitted from the primary-side resonant coil 12 of the power transmitter 10 through the magnetic field resonance.

The capacitor 115 is inserted in series with the resonant coil part 111 for adjusting the resonance frequency of the secondary-side resonant coil 110. The capacitor 115 includes terminals 115X and 115Y. Further, the adjuster 130 is coupled in parallel with the capacitor 115. The capacitor 115 is an example of a first capacitor.

The voltmeter 116 is coupled in parallel with the capacitor 115, to measure the voltage between both terminals of the capacitor 115. The voltmeter 116 detects the voltage of the AC power received by the secondary-side resonant coil 110, and transmits a signal representing the voltage to the controller 150. The AC voltage measured by the voltmeter 116 is used for synchronizing a driving signal that drives switches 131X and 131Y.

The rectifier circuit 120 includes four diodes 121 to 124. The diodes 121 to 124 are coupled in a bridge-like configuration, and rectify the full wave of the electric power input from the secondary-side resonant coil 110 to output the full-wave rectified power.

The adjuster 130 is coupled in parallel with the capacitor 115 in the resonant coil part 111 of the secondary-side resonant coil 110.

The adjuster 130 includes the switches 131X and 131Y, diodes 132X and 132Y, capacitors 133X and 133Y, terminals 134X and 134Y, and the capacitor 135.

The switches 131X and 131Y are coupled in series to each other between the terminals 134X and 134Y. The switches 131X and 131Y are examples of a first switch and a second switch, respectively. The terminals 134X and 134Y are coupled to the terminals 115X and 115Y of the capacitor 115, respectively. Therefore, the series circuit of the switches 131X and 131Y is coupled in parallel with the capacitor 115.

The diode 132X and the capacitor 133X are coupled in parallel with the switch 131X. The diode 132Y and the capacitor 133Y are coupled in parallel with the switch 131Y. The diodes 132X and 132Y have their respective anodes coupled to each other, and have their respective cathodes coupled to the capacitor 115. That is, the diodes 132X and 132Y are coupled so that the respective rectification directions are opposite.

Note that the diodes 132X and 132Y are examples of a first rectifier and a second rectifier, respectively. Also, the adjuster 130 is not required to include the capacitors 133X and 133Y.

As the switch 131X, the diode 132X, and the capacitor 133X, FETs (Field Effect Transistors) may be used, for example. The body diode between the drain and source of a P-channel or N-channel FET may be coupled to have the rectification direction of the diode 132X as in the figure. When using an N-channel FET, the source corresponds to the anode of the diode 132X and the drain corresponds to the cathode of the diode 132X.

Also, the switch 131X is implemented by switching the connection state between the drain and the source by receiving the driving signal output from the controller 150 as input into the gate. Also, the capacitor 133X is implemented by the parasitic capacitance between the drain and the source.

Similarly, as the switch 131Y, the diode 132Y, and the capacitor 133Y, FETs may be used, for example. The body diode between the drain and source of a P-channel or N-channel FET may be coupled to have the rectification direction of the diode 132Y as in the figure. When using an N-channel FET, the source corresponds to the anode of the diode 132Y and the drain corresponds to the cathode of the diode 132Y.

Also, the switch 131Y is implemented by switching the connection state between the drain and the source by receiving the driving signal output from the controller 150 as input into the gate. Also, the capacitor 133Y is implemented by the parasitic capacitance between the drain and the source.

Note that the switch 131X, the diode 132X, and the capacitor 133X are not limited to those implemented by FETs, but may be implemented by having a switch, a diode, and a capacitor coupled in parallel. This is the same for the switch 131Y, the diode 132Y, and the capacitor 133Y.

The capacitor 135 is inserted in series between the terminal 134X and a connection point 136. The connection point 136 is a point that couples one end of the switch 131X, the cathode of the diode 132X, and one end of the capacitor 133X. That is, the capacitor 135 is inserted in series with the series circuit of the switches 131X and 131Y. In other words, the capacitor 135 is inserted in series with the series circuit of the diodes 132X and 132Y, and inserted in series with the series circuit of the capacitors 133X and 133Y.

The capacitance C of LC conditions for generating resonance through magnetic field resonance in the secondary-side resonant coil 110 is set as a combined capacitance of the capacitor 135, the capacitor 115, and either the capacitor 133X or 133Y. That is, when the capacitor 135, the capacitor 115, and either the capacitor 133X or 133Y are included in the current path of the secondary-side resonant coil 110, resonance through magnetic field resonance occurs.

Note that the inductance of the conditions for generating resonance through magnetic field resonance in the secondary-side resonant coil 110 is the inductance of the secondary-side resonant coil 110.

The switches 131X and 131Y can be turned on/off in the phases opposite to each other. When the switch 131X is off and the switch 131Y is on, the power receiver 100 is in a state where a resonance current may flow in the adjuster 130 in a direction going from the terminal 134X to the terminal 134Y through the capacitor 135, the capacitor 133X and the switch 131Y, and the resonance current may flow in the capacitor 115 from the terminal 115X to the terminal 115Y. That is, the power receiver 100 in FIG. 4 transitions to a state where the resonance current may flow in the secondary-side resonant coil 110 in the clockwise direction.

Also, when the switch 131X is on and the switch 131Y is off, the current path generated in the adjuster 130 goes from the terminal 134X to the terminal 134Y through the capacitor 135, the switch 131X and the diode 132Y. Because this electric current path is parallel with the capacitor 115, the current stops flowing in the capacitor 115.

Therefore, when the power receiver 100 transitions from a state where the switch 131X is off, the switch 131Y is on, and hence, the resonance current flows in the secondary-side resonant coil 110 in the clockwise direction, to a state where the switch 131X is on and the switch 131Y is off, the resonance current stops occurring. This is because although the capacitor 135 is included in the current path, the resonant conditions are not satisfied with the capacitor 135 alone.

When the switch 131X is on and the switch 131Y is off, the power receiver 100 is in a state where a resonance current may flow in the adjuster 130 in a direction going from the terminal 134Y to the terminal 134X through the capacitor 133Y, the switch 131X, and the capacitor 135, and the resonance current may flow in the capacitor 115 from the terminal 115Y to the terminal 115X. That is, the power receiver 100 in FIG. 4 transitions to a state where the resonance current may flow in the secondary-side resonant coil 110 in the counterclockwise direction.

Also, when the switch 131X is off and the switch 131Y is on, the current path generated in the adjuster 130 goes from the terminal 134Y to the terminal 134X through the switch 131Y, the diode 132X and the capacitor 135. Because this electric current path is parallel with the capacitor 115, the current stops flowing in the capacitor 115.

Therefore, when the power receiver 100 transitions from a state where the switch 131X is on, the switch 131Y is off, and hence, the resonance current flows in the secondary-side resonant coil 110 in the counterclockwise direction, to a state where the switch 131X is off and the switch 131Y is on, the resonance current stops occurring. This is because although the capacitor 135 is included in the current path, the resonant conditions are not satisfied with the capacitor 135 alone.

The adjuster 130 switches the switches 131X and 131Y as described above to switch between a state where the resonance current may be generated, and a state where the resonance current is not generated. The switches 131X and 131Y are switched by the driving signal output from the controller 150.

The frequency of the driving signal is set to the AC frequency received by the secondary-side resonant coil 110.

The switches 131X and 131Y cut off the AC current at a high frequency as described above. For example, the adjuster 130 having two FETs combined can cut off the AC current at high speed.

Note that the driving signal and operations of the adjuster 130 will be described later below with reference to FIG. 6.

The smoothing capacitor 140 is coupled to the output side of the rectifier circuit 120, and smoothes the electric power, on which the full-wave rectification is performed by the rectifier circuit 120, and outputs the smoothed power as direct-current power. The output terminals 160X and 160Y are coupled to the output side of the smoothing capacitor 140. Because the negative component of AC power has been inverted into the positive component, the electric power on which the full-wave rectification has been performed by the rectifier circuit 120 can be treated as substantially AC power. However, stable DC power can be obtained by using the smoothing capacitor 140 even when ripple is included in the full wave rectified power.

Note that a line, which couples an upper side terminal of the smoothing capacitor 140 and the output terminal 160X, is a higher voltage side line, and a line, which couples a lower side terminal of the smoothing capacitor 140 and the output terminal 160Y, is a lower voltage side line.

The controller 150 stores, in an internal memory, data that represents the rated output of the battery 220. Further, in response to a request from the controller 15 of the power transmitter 10, the controller 150 measures electric power (received electric power), which the power receiver 100 receives from the power transmitter 10, and transmits the data, which represents the received electric power, to the power transmitter 10 via the antenna 170.

Further, upon receiving data that represents a phase difference from the power transmitter 10, the controller 150 uses the received phase difference to generate a driving signal to drive the switches 131X and 131Y. Note that the received electric power may be obtained by the controller 150 based on a voltage V measured by the voltmeter 160V and on an internal resistance value R of the battery 220. The received electric power P may be calculated by a formula of $P = V^2/R$.

Figure 5:
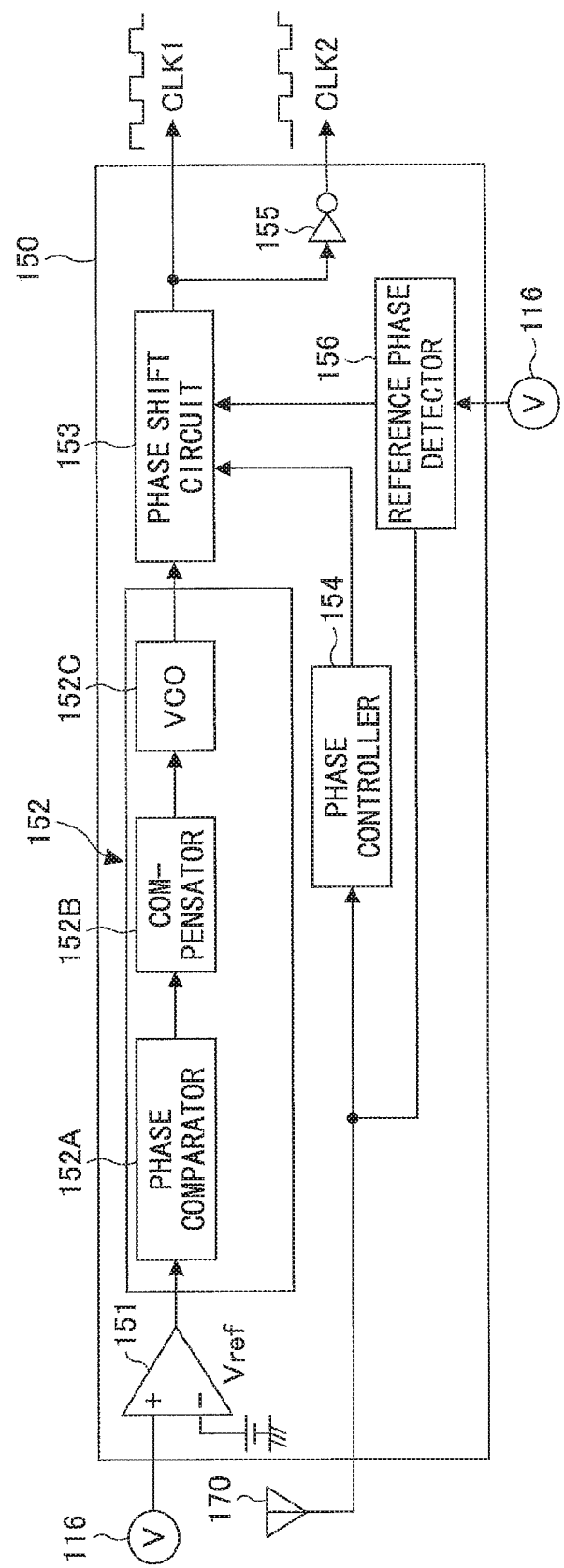
FIG. 5 is a diagram illustrating an internal configuration of a controller 150.

Here, the controller 150 will be described with reference to FIG. 5. FIG. 5 is a diagram illustrating an internal configuration of the controller 150.

The controller 150 includes a comparator 151, a PLL (Phase Locked Loop circuit) 152, a phase shift circuit 153, a phase controller 154, an inverter 155, and a reference phase detector 156.

The comparator 151 compares an AC voltage detected by the voltmeter 116 with a predetermined reference voltage Vref, and outputs a clock signal to the PLL 152.

The PLL 152 includes a phase comparator 152A, a compensator 152B, and a VCO (Voltage Controlled Oscillator) 152C. The phase comparator 152A, the compensator 152B, and VCO 152C are coupled in series, and coupled to have the output of VCO 152C fed back to the phase comparator 152A. Configured as such, the PLL 152 outputs a clock signal that is synchronized with the signal input from the comparator 151.

The phase shift circuit 153 is coupled on the output side of the PLL 152, and based on a signal representing the phase difference that is input from the phase controller 154, shifts the phase of the clock signal output from the PLL 152 with respect to the reference phase, and outputs the shifted clock signal. As the phase shift circuit 153, a phase shifter may be used, for example.

Upon receiving the signal representing the phase difference transmitted from the power transmitter 10 as input, the phase controller 154 converts the signal representing the phase difference into a signal for the phase shift circuit 153, and outputs the converted signal.

The clock signal whose phase has been shifted by the phase difference with respect to the reference phase based on the signal input from the phase controller 154, is branched off in two ways; one is output as it is as a clock signal CLK1, and the other is inverted by the inverter 155, and output as a clock signal CLK2. The clock signals CLK1 and CLK2 are control signals output by the controller 150.

The reference phase detector 156 controls the amount of shift by which the phase shift circuit 153 shifts the phase of the clock signal, so as to adjust the phase of the clock signal output by the phase shift circuit 153 with respect to the clock signal output by the PLL 152, and to detect the phase in which the maximum efficiency of electric power reception is obtained.

Then, the reference phase detector 156 holds the detected phase in its internal memory as the reference phase. The operating point at which the efficiency of electric power reception reaches the maximum is a point at which the voltage value detected by the voltmeter 116 reaches the maximum. Therefore, the reference phase detector 156 adjusts the amount of shift of the phase given in the phase shift circuit 153 to detect a point at which the voltage value detected by the voltmeter 116 reaches the maximum, and holds the phase at the operating point in its internal memory as the reference phase.

Here, the clock signal output by the PLL 152 corresponds to the phase of the AC voltage through magnetic field resonance detected by the voltmeter 116. Therefore, adjusting the amount of shift of the phase given by the phase shift circuit 153 to the clock signal output by the PLL 152 is controlling, in the phase shift circuit 153, the amount of shift of the phase of the clock signal with respect to the voltage waveform detected by the voltmeter 116.

The reference phase is a phase of the clock signals CLK1 and CLK2 with respect to the AC voltage in which the maximum efficiency of electric power reception is obtained. For adjusting the received electric power with this this reference phase treated as 0 degrees, the phase difference of the phase of the clock signals CLK1 and CLK2 with respect to the reference phase (0 degrees) is adjusted in the phase shift circuit 153.

Here, because a phase of the AC voltage is not detected, the amount of shift of the phase given by the phase shift circuit 153 to the clock signals CLK1 and CLK2 with which the maximum efficiency of electric power reception is obtained, is treated as the reference phase.

Note that although the embodiment is described here in which the phase of the clock signal output from the PLL 152 is adjusted by the phase shift circuit 153 with respect to the AC voltage detected by the voltmeter 116, an ammeter may be used instead of the voltmeter 116, to adjust the phase of the clock signal in the phase shift circuit 153 with respect to the AC current.

The voltmeter 160V is coupled between the output terminals 160X and 160Y. The voltmeter 160V is used to calculate the received electric power of the power receiver 100. Because in comparison with a case of measuring received electric power by measuring an electric current, losses are low by obtaining the received electric power based on the voltage V measured by the voltmeter 160V and on the internal resistance value R of the battery 220 as described above, thus it is a preferable measuring method. However, the received electric power of the power receiver 100 may also be calculated by measuring the electric current and the voltage. When measuring the electric current, a Hall Element, a magnetic resistance element, a detection coil, a resistor, or the like may be used for the measurement.

The DC-DC converter 210 is coupled to the output terminals 160X and 160Y, and converts the voltage of the direct-current power that is output from the power receiver 100 into the rated voltage of the battery 220 to output the converted voltage. The DC-DC converter 210 lowers the output voltage of the rectifier circuit 120 to the rated voltage of the battery 220 in a case where the output voltage of the rectifier circuit 120 is higher than the rated voltage of the battery 220. The DC-DC converter 210 raises the output voltage of the rectifier circuit 120 to the rated voltage of the battery 220 in a case where the output voltage of the rectifier circuit 120 is lower than the rated voltage of the battery 220.

The battery 220 may be any rechargeable secondary battery that can be repeatedly charged. For example, a lithium ion battery may be used as the battery 220. For example, in a case where the power receiver 100 is included in an electronic device such as a tablet computer or a smartphone, the battery 220 is a main battery of such an electronic device.

For example, the primary-side coil 11, the primary-side resonant coil 12, and the secondary-side resonant coil 110 may be made by winding copper wire. However, materials of the primary-side coil 11, the primary-side resonant coil 12, and the secondary-side resonant coil 110 may be metal other than copper (e.g., gold, aluminum, etc.). Further, materials of the primary-side coil 11, the primary-side resonant coil 12, and the secondary-side resonant coil 110 may be different from one another.

In such a configuration, the primary-side coil 11 and the primary-side resonant coil 12 correspond to a power transmitting side, and the secondary-side resonant coil 110 corresponds to a power receiving side.

According to a magnetic field resonance system, magnetic field resonance, generated between the primary-side resonant coil 12 and the secondary-side resonant coil 110, is utilized to transmit electric power from the power transmitting side to the power receiving side. Hence, it is possible to transmit the electric power over a longer distance than that of an electromagnetic induction system that utilizes electromagnetic induction to transmit electric power from the power transmitting side to the power receiving side.

The magnetic field resonance system is more flexible than the electromagnetic induction system with respect to the position gap or the distance between the resonant coils. The magnetic field resonance system thus has an advantage called "free-positioning".

Next, current paths generated when the switches 131X and 131Y are driven by the driving signal will be described with reference to FIG. 6 and FIG. 7.

Figure 6:
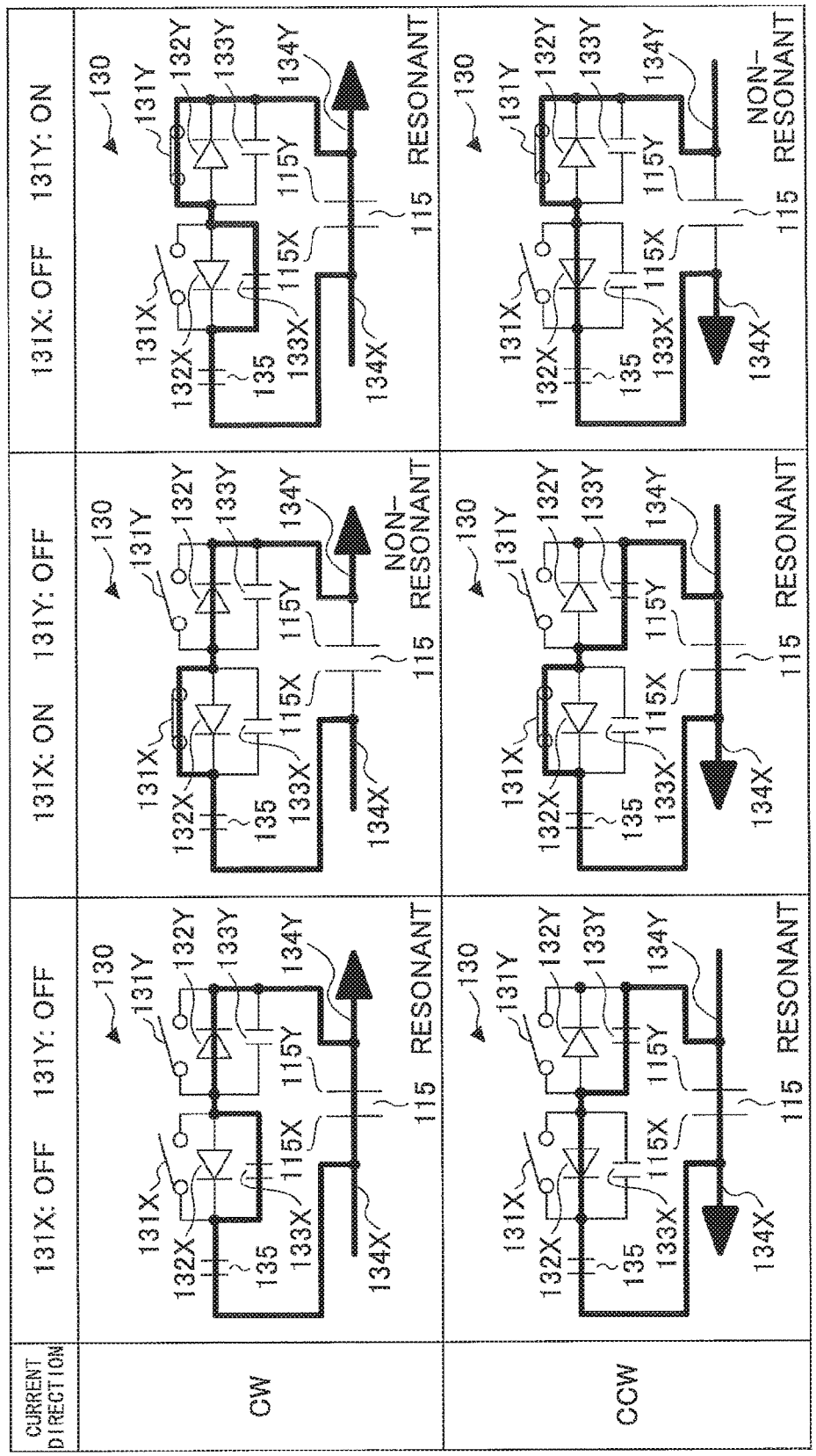
FIG. 6 is a diagram illustrating current paths in a capacitor 115 and an adjuster 130.

FIG. 6 is a diagram illustrating current paths in the capacitor 115 and the adjuster 130. In FIG. 6, as in FIG. 4, an electric current direction will be referred to as the clockwise (CW) direction for an electric current flowing from the terminal 134X to the terminal 134Y through the capacitor 115 or the inside of the adjuster 130. Also, an electric current direction will be referred to as the counterclockwise (CCW) direction for an electric current flowing from the terminal 134Y to the terminal 134X through the capacitor 115 or the inside of the adjuster 130.

Further, clock signals CLK1 and CLK2 are described here in a case where the switches 131X and 131Y are P-channel FETs. The switches 131X and 131Y are turned on when the clock signals CLK1 and CLK2 are at the L level. The switches 131X and 131 are turned off when the clock signals CLK1 and CLK2 are at the H level.

First, in a case where the switches 131X and 131Y are both off and an electric current flows clockwise (CW), a resonance current flows in the direction from the terminal 134X to the terminal 134Y through the capacitor 135, the capacitor 133X, and the diode 132Y, and the resonance current flows in the capacitor 115 from the terminal 115X to the terminal 115Y. Therefore, the resonance current flows in the secondary-side resonant coil 110 in the clockwise direction.

In a case where the switches 131X and 131Y are both off and an electric current flows counterclockwise (CCW), a resonance current flows in the direction from the terminal 134Y to the terminal 134X through the capacitor 133Y, the diode 132X, and the capacitor 135, and the resonance current flows in the capacitor 115 from the terminal 115Y to the terminal 115X. Therefore, the resonance current flows in the secondary-side resonant coil 110 in the counterclockwise direction.

In a case where the switch 131X is on, the switch 131Y is off, and an electric current flows clockwise (CW), the current path generated in the adjuster 130 goes from the terminal 134X to the terminal 134Y through the capacitor 135, the switch 131X and the diode 132Y. Because this electric current path is parallel with the capacitor 115, the current stops flowing in the capacitor 115. Therefore, the resonance current does not flow in the secondary-side resonant coil 110. Note that in this case, even if the switch 131Y is turned on, the resonance current does not flow in the secondary-side resonant coil 110.

In a case where the switch 131X is on, the switch 131Y is off, and an electric current flows counterclockwise (CCW), a resonance current flows in the adjuster 130 in the direction from the terminal 134Y to the terminal 134X through the capacitor 133Y, the switch 131X, and the capacitor 135, and the resonance current flows in the capacitor 115 from the terminal 115Y to the terminal 115X. Therefore, the resonance current flows in the secondary-side resonant coil 110 in the counterclockwise direction. Note that electric current also flows in the diode 132X, which is parallel with the switch 131X.

In a case where the switch 131X is off, the switch 131Y is on, and an electric current flows clockwise (CW), a resonance current flows in the adjuster 130 in the direction from the terminal 134X to the terminal 134Y through the capacitor 135, the capacitor 133X, and the switch 131Y, and the resonance current flows in the capacitor 115 from the terminal 115X to the terminal 115Y. Therefore, the resonance current flows in the secondary-side resonant coil 110 in the clockwise direction. Note that electric current also flows in the diode 132Y, which is parallel with the switch 131Y.

In a case where the switch 131X is off, the switch 131Y is on, and an electric current flows counterclockwise (CCW), the current path generated in the adjuster 130 goes from the terminal 134Y to the terminal 134X through the switch 131Y, the diode 132X, and the capacitor 135. Because this electric current path is parallel with the capacitor 115, the current stops flowing in the capacitor 115. Therefore, the resonance current does not flow in the secondary-side resonant coil 110. Note that in this case, even if the switch 131X is turned on, the resonance current does not flow in the secondary-side resonant coil 110.

Note that the electrostatic capacitance that contributes to the resonance frequency of the resonance current is determined depending on the three capacitors of the capacitor 115, the capacitor 132X or 132Y, and the capacitor 135. Either the capacitor 132X or 132Y is included in the three capacitors. Therefore, it is desirable that the electrostatic capacitance of the capacitor 132X is equal to the electrostatic capacitance of the capacitor 132Y.

Figure 7A:
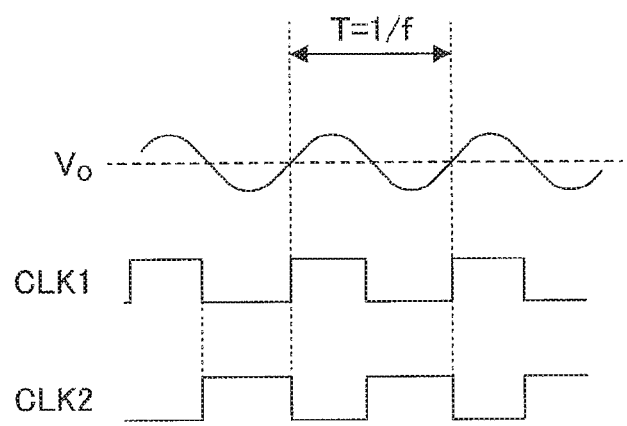
FIGS. 7A and 7B are diagrams illustrating an AC voltage generated in a secondary-side resonant coil 110 and two clock signals included in a driving signal.
Figure 7B:
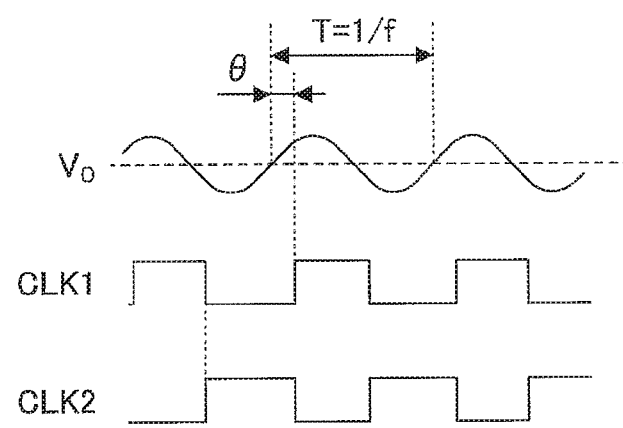

FIGS. 7A and 7B are diagrams illustrating an AC voltage generated in the secondary-side resonant coil 110 and two clock signals included in a driving signal.

An AC voltage $V_0$ illustrated in FIG. 7A and FIG. 7B is represented by a waveform having the same frequency as the power transmission frequency, is an AC voltage generated, for example, in the secondary-side resonant coil 110, and detected by the voltmeter 116 (see FIG. 4).

When the AC voltage $V_0$ is positive and resonance occurs in the secondary-side resonant coil 110, an electric current flows clockwise (CW) in the secondary-side resonant coil 110 in the direction from the terminal 134X to the terminal 134Y. When the AC voltage $V_0$ is negative and resonance occurs in the secondary-side resonant coil 110, an electric current flows counterclockwise (CCW) in the secondary-side resonant coil 110 in the direction from the terminal 134Y to the terminal 134X.

Also, the clock signals CLK1 and CLK2 are two clock signals included in a driving signal. For example, the clock signal CLK1 is used to drive the switch 131X, and the clock signal CLK2 is used to drive the switch 131Y. The clock signals CLK1 and CLK2 are examples of a first signal and a second signal, respectively.

In FIG. 7A, the clock signals CLK1 and CLK2 are synchronized with the AC voltage $V_0$. That is, the frequency of the clock signals CLK1 and CLK2 is equal to the frequency of the AC voltage $V_0$, and the phase of the clock signal CLK1 is equal to the phase of the AC voltage $V_0$. Note that the clock signal CLK2 has a phase different from that of the clock signal CLK1 by 180 degrees, namely, the opposite phase.

In FIG. 7A, the period T of the AC voltage $V_0$ is the reciprocal of the frequency f, and the frequency f is 6.78 MHz.

As illustrated in FIG. 7A, the clock signals CLK1 and CLK2 synchronizing with the AC voltage $V_0$ may be generated by the controller 150 using the PLL 152 in a state where the switches 131X and 131Y are turned off, and further in a state where the power receiver 100 receives electric power from the power transmitter 10 and generates a resonance current in the secondary-side resonant coil 110.

While not directly measuring the phase of the AC voltage (AC voltage $V_0$) generated in the secondary-side resonant coil 110, the power receiver 100 enters a state in which a resonant current is generated in the secondary-side resonant coil 110 by receiving electric power from the power transmitter with respect to the state of turning off the switches 131X and 131Y. Then, the controller 150 outputs the clock signals CLK1 and CLK2, and the controller 150 adjusts the amount of shift of the phase of the clock signals CLK1 and CLK2 to obtain a point at which received electric power is the maximum. Thereby, the clock signals CLK1 and CLK2 synchronizing with the AC voltage $V_0$ can be obtained.

In FIG. 7B, the phases of the clock signals CLK1 and CLK2 are behind the AC voltage $V_0$ by $\theta$ degrees. Such clock signals CLK1 and CLK2 having the phase difference of $\theta$ degrees with respect to the AC voltage $V_0$ may be generated by the controller 150 using the phase shift circuit 153.

The controller 150 adjusts the phase difference of the two clock signals CLK1 and CLK2 with respect to the AC voltage $V_0$, to detect a phase at which the maximum efficiency of electric power reception is obtained. The phase in which the maximum efficiency of electric power reception obtained is a phase in which the electric power received by the power receiver 100 reaches the maximum, and the received power reaches the maximum when the resonance state continues over the entire period of one cycle because of the phase difference of the two clock signals CLK1 and CLK2 with respect to the AC voltage $V_0$. Therefore, the controller 150 increases and decreases the phase difference of the two clock signals CLK1 and CLK2 with respect to the AC voltage $V_0$ to detect the phase difference that makes the received electric power maximum, and treats the detected phase difference as 0 degrees.

This is because the received electric power becomes maximum when the phases of the clock signals CLK1 and CLK2 are synchronized with the phase of the AC voltage $V_0$ as illustrated in FIG. 7A.

Then, based on the phase difference that makes the received power the maximum (0 degrees) and data received from the power transmitter 10 representing the phase difference, the controller 150 sets the phase difference of the two clock signals with respect to the AC voltage $V_0$ in the phase shift circuit 153.

Next, with reference to FIG. 8, the efficiency of electric power reception of the power receiver 100 will be described when receiving the power from the power transmitter 10 in a case where the phase difference of the driving signal is adjusted.

Figure 8:
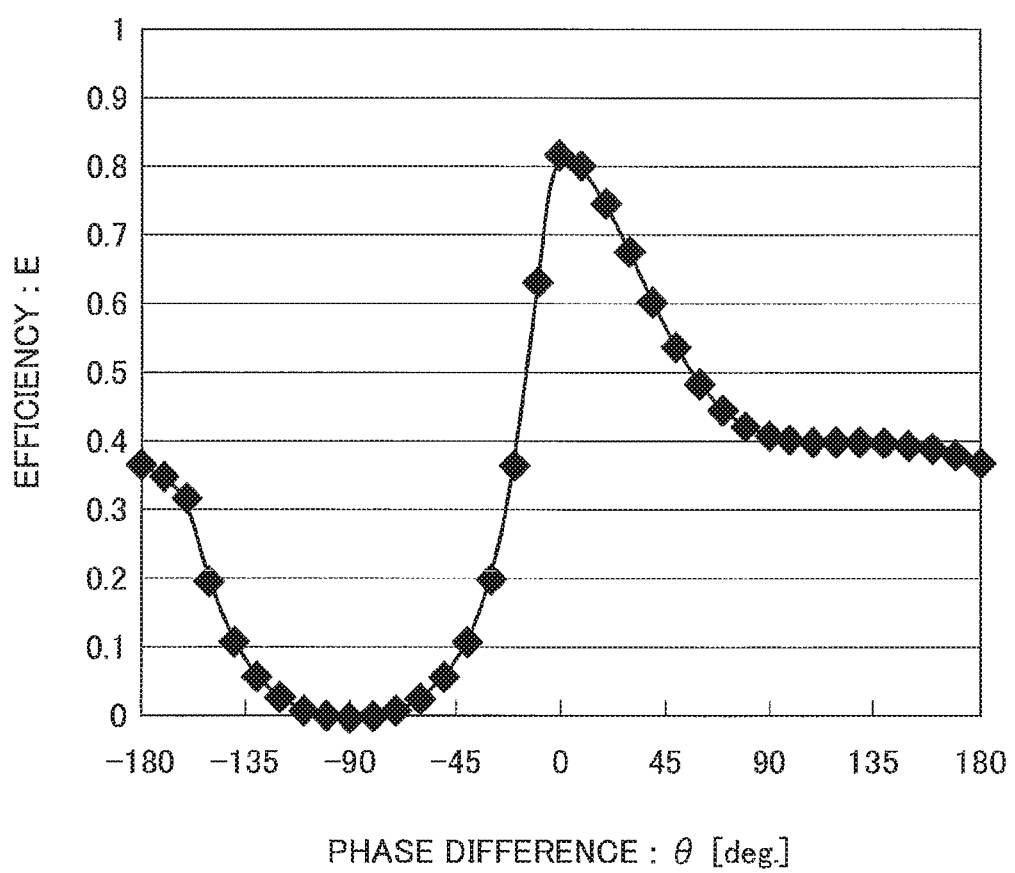
FIG. 8 is a diagram illustrating a simulation result that represents a property of efficiency of electric power reception with respect to a phase difference.

FIG. 8 is a diagram illustrating a simulation result representing a property of efficiency of electric power reception with respect to a phase difference of a driving signal. Here, the phase difference is a phase difference of the phase of the driving signal (including the clock signals CLK1 and CLK2) with respect to the reference phase (0 degrees), which is also a phase difference of the phase of the driving signal (including the clock signals CLK1 and CLK2) with respect to the AC voltage $V_O$.

The phase difference on the horizontal axis represents the phase difference of the two clock signals with respect to the AC voltage $V_O$ where 0 degrees is set as the phase difference making the received electric power maximum. The efficiency of electric power reception on the vertical axis represents the ratio of electric power output by the power receiver 100 (Pout) to electric power input into the power transmitter 10 by the AC power supply 1 (Pin) (see FIG. 1). The efficiency of electric power reception is equal to the efficiency of electric power transmission between the power transmitter 10 and the power receiver 100.

Note that the frequency of the electric power transmitted by the power transmitter 10 is 6.78 MHz, and the frequency of the driving signal is set to be the same. Also, the state where the phase difference is 0 degrees is a state where the resonance through magnetic resonance is generated in the secondary-side resonant coil 110 over the entire period of one cycle of the resonance current, and the resonance current is flowing in the secondary-side resonant coil 110.

An increase of the phase difference means that the operating point deviates from the resonance point at which the phase difference is 0 degrees.

As illustrated in FIG. 8, upon an increase of the phase difference from 0 degrees, the efficiency of electric power reception decreases. Increasing the phase difference from 0 degrees is delaying the phase of the clock signals CLK1 and CLK2 with respect to the AC voltage $V_O$.

When the phase difference is 0 degrees, the efficiency of electric power reception is approximately 0.8, which is a value corresponding to the maximum value of the theoretical value of the efficiency of electric power reception. When the phase difference is approximately 45 degrees, the efficiency of electric power reception is approximately 0.5. When the phase difference is 90 degrees, the efficiency of electric power reception is approximately 0.4. When the phase difference is in a range of from 90 degrees to 180 degrees, the efficiency of electric power reception is substantially constant at approximately 0.4.

Further, upon a decrease of the phase difference from 0 degrees, the efficiency of electric power reception decreases. Decreasing the phase difference from 0 degrees is advancing the phase of the clock signals CLK1 and CLK2 with respect to the AC voltage $V_O$.

When the phase difference is approximately −45 degrees, the efficiency of electric power reception is approximately 0.1. When the phase difference is approximately −90 degrees, the efficiency of electric power reception is approximately 0. Upon a decrease of the phase difference from −90 degrees to −180 degrees, the efficiency of electric power reception gradually increases, and when the phase difference is approximately −180 degrees, the efficiency of electric power reception is approximately 0.4.

In this way, upon a change of the phase difference of the driving signal (including the clock signals CLK1 and CLK2) with respect to the AC voltage $V_O$, the amount of electric power of the resonance current that flows in the secondary-side resonant coil 110 changes and therefore the efficiency of electric power reception changes.

Further, the property of the efficiency of electric power reception with respect to the phase difference in the operation range in which the phase difference is a positive value differs from the property of the efficiency of electric power reception with respect to the phase difference in the operation range in which the phase difference is a negative value.

The efficiency of electric power reception has an asymmetric property with respect to the operating point at which the phase difference is 0 degrees (resonance point). This is related to the capacitor 135 included in the adjustor 130.

According to a simulation result, with respect to the asymmetric property with respect to the operating point (resonance point) at which the phase difference is 0 degrees, the efficiency of electric power reception with respect to the phase difference in a case where the adjustor 130 includes the capacitor 135 is more noticeable than the efficiency of electric power reception with respect to the phase difference in a case where the adjustor 130 does not include the capacitor 135.

Figure 9:
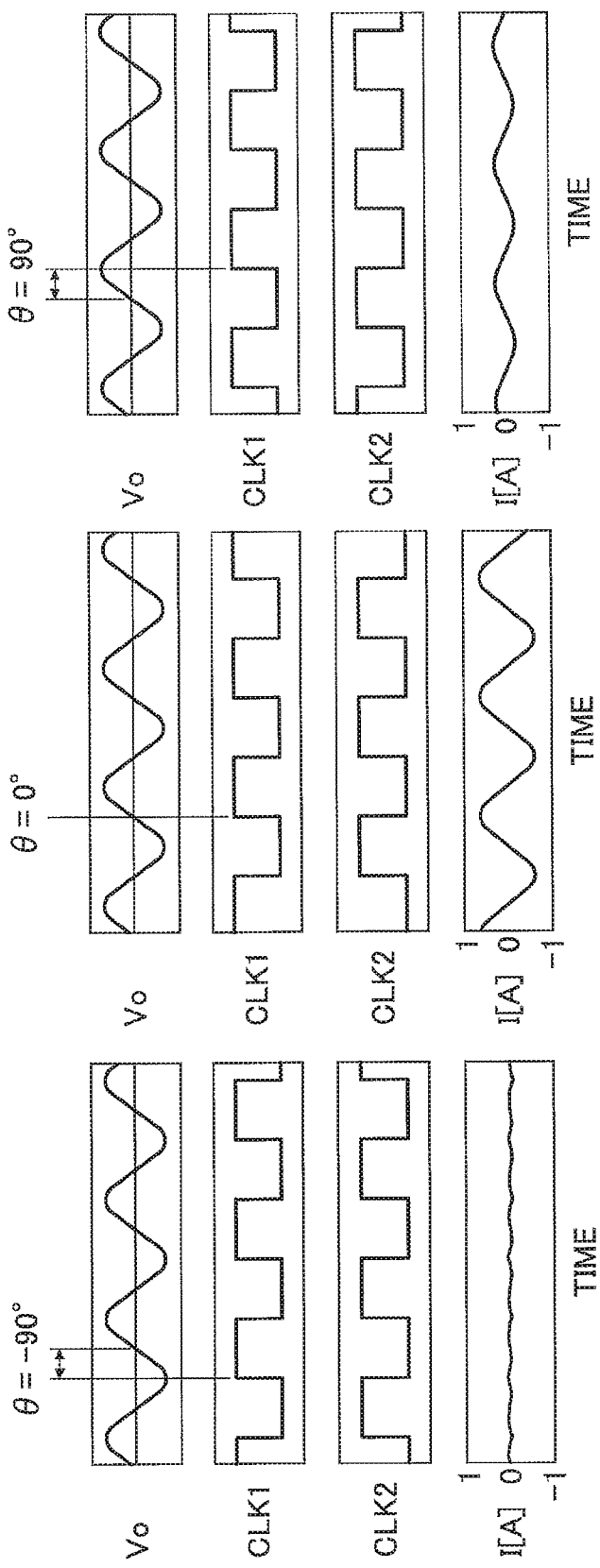
FIGS. 9A to 9C are diagrams illustrating a simulation result that represents relationships between phase differences and efficiencies of electric power reception.

FIGS. 9A to 9C are diagrams illustrating a simulation result that represents relationships between phase differences and efficiencies of electric power reception.

FIG. 9A illustrates a relationship between the AC voltage $V_O$, the clock signals CLK1 and CLK2, and an electric current I when the phase difference is −90 degrees. The electric current I is an electric current that flows in the secondary-side resonant coil 110.

FIG. 9B illustrates a relationship between the AC voltage $V_O$, the clock signals CLK1 and CLK2, and an electric current I when the phase difference is 0 degrees. FIG. 9C illustrates a relationship between the AC voltage $V_O$, the clock signals CLK1 and CLK2, and an electric current I when the phase difference is 90 degrees.

As illustrated in FIG. 9B, the amplitude of the electric current I is the largest when the phase difference is 0 degrees. This is because the received electric power becomes the largest at the resonance point.

As illustrated in FIG. 9C, when the phase difference is 90 degrees, although the amplitude of the electric current I is smaller than the amplitude of the electric current I at the resonance point, electric current flows.

As illustrated in FIG. 9A, when the phase difference is −90 degrees, the amplitude of the electric current I is substantially 0, and electric current does not flow substantially.

It is considered from the simulation result that the capacitor 115 and the adjuster 130 are in an insulated state when the phase difference is −90 degrees. More specifically, it is considered that the combined impedance of the capacitor 115 and the capacitor 135 conforms to an insulated state.

Further, it is considered that when the phase difference is 90 degrees, an induced current through electromagnetic induction flows in the secondary-side resonant coil 110 at an operating point away from the resonance point. It is considered that, in this case, the capacitor 115 and the adjuster 130 are in a short circuit state. More specifically, it is considered that the combined impedance of the capacitor 115 and the capacitor 135 conforms to a short circuit state.

In this way, in an operation range for increasing the phase difference from 0 degrees and an operation range for decreasing the phase difference from 0 degrees, the impedance of the capacitor 115 and the adjuster 130 differs. Therefore, it is considered as an asymmetry property with respect to the operating point at which the phase difference is 0 degrees (resonance point) as illustrated in FIG. 8.

Here, for adjusting the phase difference to adjust the efficiency of electric power reception of the power receiver 100, an adjustable range is greater in an operation range where the difference between the minimum value and the maximum value of the efficiency of electric power reception is greater. This is because a more dynamic range can be obtained from such an operation range of greater difference.

Therefore, according to the first embodiment, for example, an operation range where the phase difference may take a negative value is used to adjust the efficiency of electric power reception of the power receiver 100 such that a more dynamic range can be obtained.

It should be noted that the above is not intended to limit to use of an operation range where the phase difference takes a negative value to adjust the efficiency of electric power reception of the power receiver 100. Accordingly, an operation range where the phase difference takes a positive value may also be used to adjust the efficiency of electric power reception of the power receiver 100.

Figure 10:
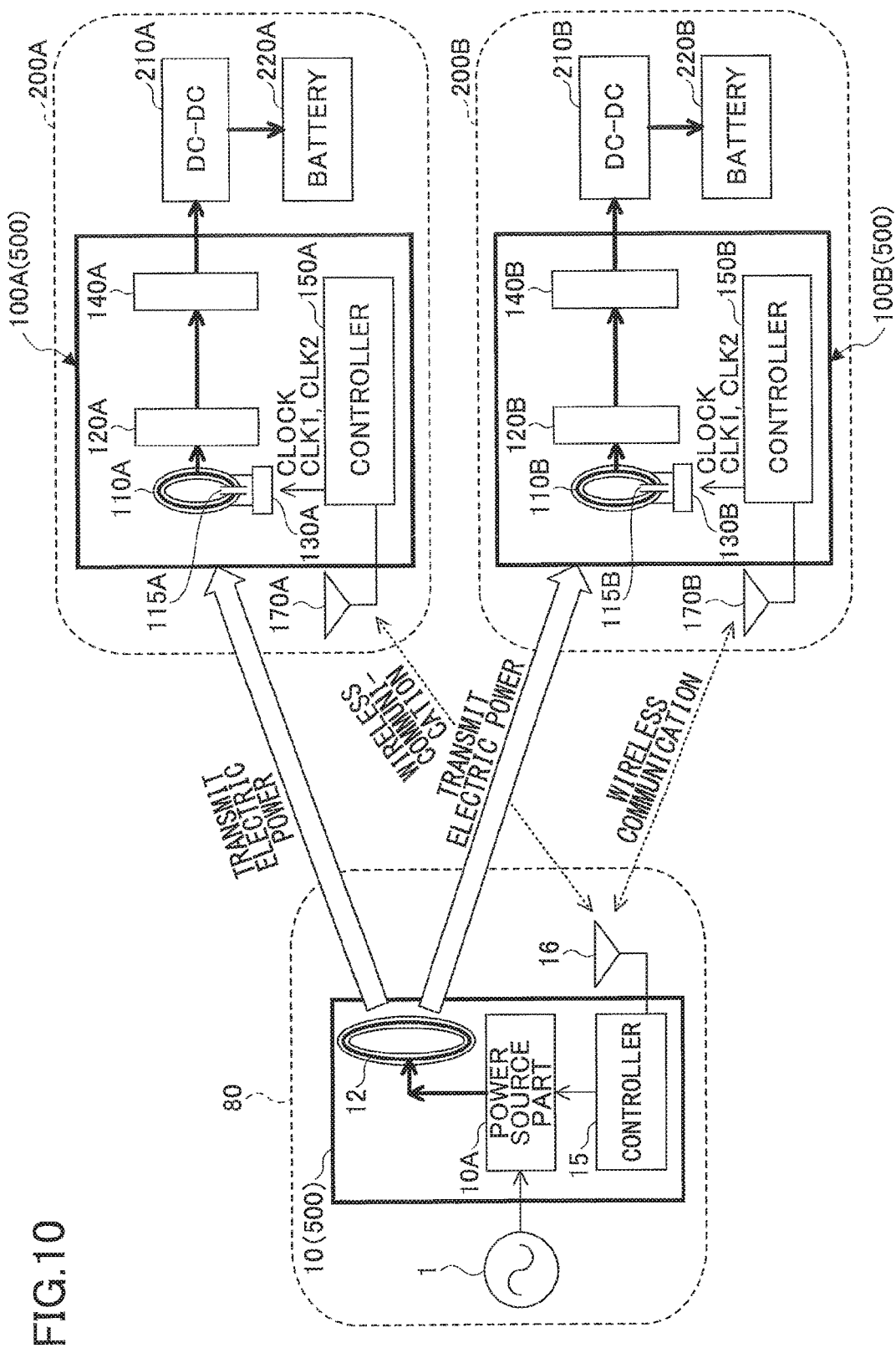
FIG. 10 is a diagram illustrating electronic devices 200A and 200B and the power transmitting apparatus 80 using a power transmitting system 500 according to the first embodiment.

FIG. 10 is a diagram illustrating electronic devices 200A and 200B and the power transmitting apparatus 80 using a power transmitting system 500 according to the first embodiment.

Although the power transmitting apparatus 80 in FIG. 10 is the same as the power transmitting apparatus 80 illustrated in FIG. 4, configuration elements other than the primary-side coil 11, the controller 15, and the antenna 16 in FIG. 4 are expressed as a power source part 10A. The power source part 10A expresses the primary-side resonant coil 12, the matching circuit 13, and the capacitor 14 collectively. Note that the AC power source 1, the primary-side resonant coil 12, the matching circuit 13, and the capacitor 14 may be treated as the power source part collectively.

For example, the antenna 16 may be any antenna that can perform wireless communication in a short distance such as Bluetooth (registered trade mark). The antenna 16 is provided in order to receive, from the power receivers 100A and 100B included in the electronic devices 200A and 200B, data representing the received electric power and the rated output. The received data is input to the controller 15. The controller 15 is an example of a controller and, is an example of a third communication part.

Each of the electronic devices 200A and 200B may be a terminal device such as a tablet computer or a smartphone, for example. The electronic devices 200A and 200B respectively include the power receivers 100A and 100B, DC-DC converters 210A and 210B, and batteries 220A and 220B.

The power receivers 100A and 100B have a configuration equivalent to that of the power receiver 100 illustrated in FIG. 4. Each of the DC-DC converters 210A and 210B is equivalent to the DC-DC converter 210 illustrated in FIG. 4. Further, each of the batteries 220A and 220B is equivalent to the battery 220 illustrated in FIG. 4.

The power receiver 100A includes a secondary-side resonant coil 110A, a capacitor 115A, a rectifier circuit 120A, an adjuster 130A, a smoothing capacitor 140A, a controller 150A, and an antenna 170A. The secondary-side resonant coil 110A is an example of a first secondary-side resonant coil.

The secondary-side resonant coil 110A, the capacitor 115A, the rectifier circuit 120A, the adjuster 130A, the smoothing capacitor 140A, and the controller 150A respectively correspond to the secondary-side resonant coil 110, the capacitor 115, the rectifier circuit 120, the adjuster 130, the smoothing capacitor 140, and the controller 150 illustrated in FIG. 4. Note that, in FIG. 10, the secondary-side resonant coil 110A, the rectifier circuit 120A, and the smoothing capacitor 140A are illustrated in a simplified manner, and the voltmeter 160V and the output terminals 160X and 160Y are omitted.

The power receiver 100B includes a secondary-side resonant coil 110B, a capacitor 115B, a rectifier circuit 120B, an adjuster 130B, a smoothing capacitor 140B, a controller 150B, and an antenna 170B. The power receiver 100B is an example of another power receiver as seen from the power receiver 100A. The secondary-side resonant coil 110B is an example of a second secondary-side resonant coil.

The secondary-side resonant coil 110B, the capacitor 115B, the rectifier circuit 120B, the adjuster 130B, the smoothing capacitor 140B, and the controller 150B respectively correspond to the secondary-side resonant coil 110, the capacitor 115, the rectifier circuit 120, the adjuster 130, the smoothing capacitor 140, and the controller 150 illustrated in FIG. 4. Note that, in FIG. 10, the secondary-side resonant coil 110B, the rectifier circuit 120B, the adjuster 130B, and the smoothing capacitor 140B are illustrated in a simplified manner, and the voltmeter 160V and the output terminals 160X and 160Y are omitted.

For example, the antennas 170A and 170B may be any antenna that can perform wireless communication in a short distance such as Bluetooth (registered trade mark). The antennas 170A and 170B are provided in order to perform data communication with the antenna 16 of the power transmitter 10. The antennas 170A and 170B are coupled to the controllers 150A and 150B of the power receivers 100A and 100B, respectively. The controllers 150A and 150B are examples of a drive controller. The controllers 150A and 150B are examples of a first communication part and a second communication part, respectively.

The controller 150A of the power receiver 100A transmits, to the power transmitter 10 via the antenna 170A, data representing received electric power of the secondary-side resonant coil 110A and a rated output of the battery 220A. Similarly, the controller 150B of the power receiver 100B transmits, to the power transmitter 10 via the antenna 170B, data representing received electric power of the secondary-side resonant coil 110B and a rated output of the battery 220B.

In a state where the electronic devices 200A and 200B are arranged close to the power transmitting apparatus 80, the electronic devices 200A and 200B can respectively charge the batteries 220A and 220B without contacting the power transmitting apparatus 80. The batteries 220A and 220B can be charged at the same time.

The power transmitting system 500 is structured with the power transmitter 10 and the power receivers 100A and 100B of the configuration elements illustrated in FIG. 10. That is, the power transmitting apparatus 80 and the electronic devices 200A and 200B adopt the power transmitting system 500 that enables electric power transmission in a non-contact state through magnetic field resonance.

Here, when the batteries 220A and 220B are charged at the same time, a state may occur in which the balance of electric power supplied to the electronic devices 200A and 200B is not good as described with reference to FIG. 2 and FIG. 3.

Hence, in order to improve the balance of supplied electric power, the power transmitter 10 sets, based on the efficiency of electric power reception of the secondary-side resonant coil 110A, on the rated output of the battery 220A, on the efficiency of electric power reception of the secondary-side resonant coil 110B, and on the rated output of the battery 220B, phase differences of the driving signals (the clock signals CLK1 and CLK2), which drive the adjusters 130A and 130B, with respect to the AC voltage $V_0$.

Figure 11:
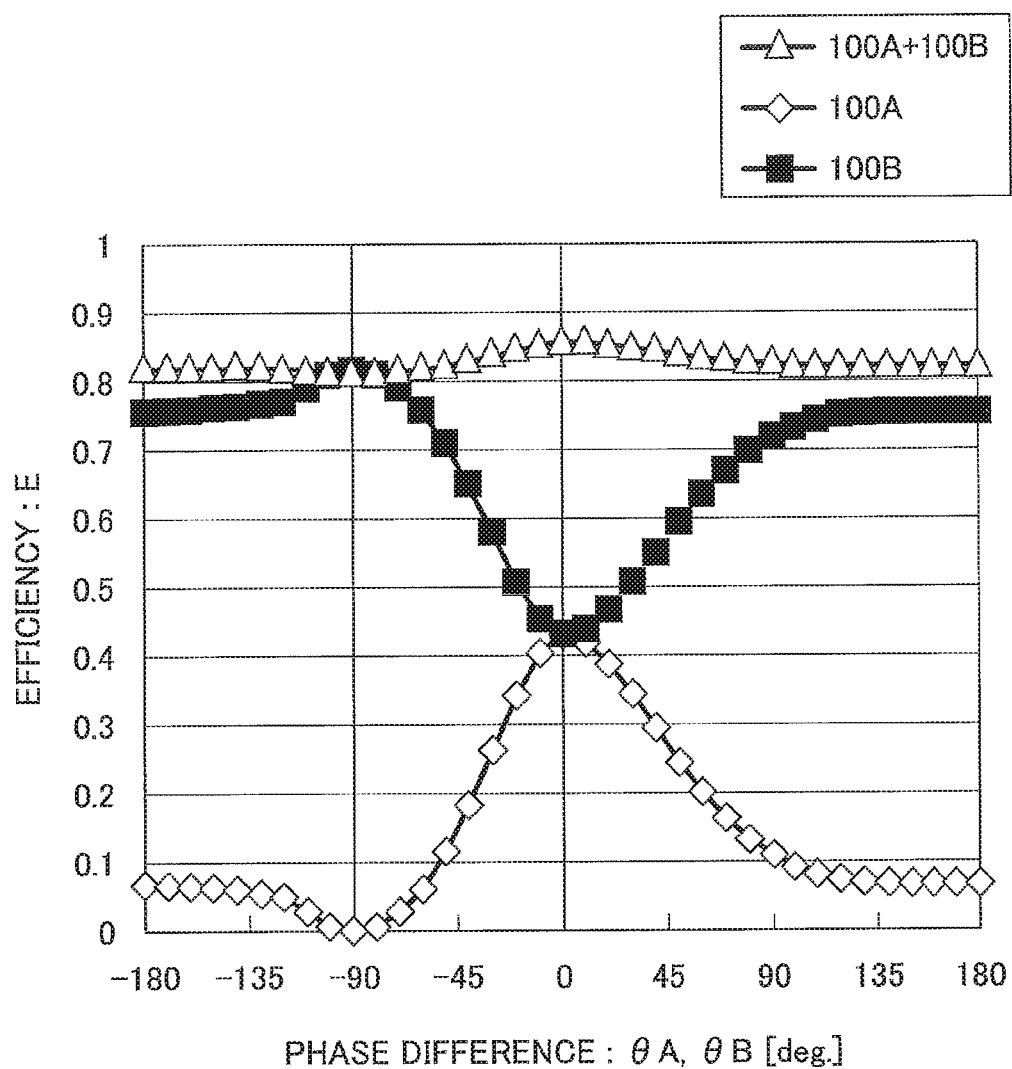
FIG. 11 is a diagram illustrating a relationship between the phase differences of the driving signals and the efficiencies of electric power reception of the power receivers 100A and 100B.

FIG. 11 is a diagram illustrating a relationship between the phase differences of the driving signal and the efficiencies of electric power reception of the power receivers 100A and 100B.

A case will be described here where the phase difference of the driving signal for driving the adjuster 130A of the power receiver 100A is changed from the phase difference (0 degrees) at which the efficiency of electric power reception reaches the maximum, in a state where the phase difference of the driving signal for driving the adjuster 130B of the power receiver 100B is fixed to the phase difference (0 degrees) at which the efficiency of electric power reception reaches the maximum.

Note that the frequency of the electric power transmitted by the power transmitter 10 is 6.78 MHz, and the frequency of the driving signal is set to be the same. Further, the coupling coefficient k of the primary-side resonant coil 12 with the secondary-side resonant coil 110A and the coupling coefficient k of the primary-side resonant coil 12 with the secondary-side resonant coil 110B are both set to be 0.1. Further, the Q factors of the primary-side resonant coil 12 and the secondary-side resonant coils 110A and 110B are both set to be 100, and the inductances of the primary-side resonant coil 12 and the secondary-side resonant coil 110A and 110B are set to be 1 pH. The maximum efficiency theoretically obtained for the above is 0.819.

In FIG. 11, the horizontal axis represents the phase differences (θA, θB) of the driving signals for driving the adjusters 130A and 130B of the power receivers 100A and 100B. Also, the vertical axis on the left represents the respective efficiencies of electric power reception of the power receivers 100A and 100B, and the total value of the efficiencies of electric power reception of the power receivers 100A and 100B.

In a state where the phase difference of the driving signal for driving the adjuster 130B of the power receiver 100B is fixed to 0 degrees, when the phase difference of the driving signal for driving the adjuster 130A of the power receiver 100A is increased or decreased from 0 degrees, as illustrated in FIG. 11, the efficiency of electric power reception of the power receiver 100A decreases. The efficiency of electric power reception of the power receiver 100A is the maximum when the phase difference is 0 degrees. Also, the efficiency of electric power reception of the power receiver 100B increases in response to a decrease of the efficiency of electric power reception of the power receiver 100A.

In this way, when the phase difference of the driving signal for driving the adjuster 130A of the power receiver 100A is changed, the amount of electric power received by the power receiver 100A decreases, and therefore the electric current flowing in the power receiver 100A also decreases. That is, changing the phase difference changes the impedance of the power receiver 100A.

In simultaneous electric power transmission using magnetic field resonance, electric power, transmitted from the power transmitter 10 to the power receivers 100A and 100B through the magnetic field resonance, is distributed to the power receivers 100A and 100B. Therefore, when the phase difference of the driving signal for driving the adjuster 130A of the power receiver 100A is changed from 0 degrees, the amount of electric power to be received by the power receiver 100B increases by the decreased amount of the electric power to be received by the power receiver 100A. The efficiencies of electric power reception of the power receivers 100A and 100B are both approximately 0.4 when the phase difference is 0 degrees.

Therefore, as illustrated in FIG. 11, when the phase difference is changed from 0 degrees, the ratio of the efficiency of electric power reception of the power receiver 100A decreases. Further, in response to the decrease of the ratio of the efficiency of electric power reception of the power receiver 100A, the ratio of the efficiency of electric power reception of the power receiver 100B increases.

When the phase difference of the driving signal for driving the adjuster 130A of the power receiver 100A changes from 0 degrees to −90 degrees, the efficiency of electric power reception of the power receiver 100A decreases to nearly 0, and the efficiency of electric power reception of the power receiver 100B increases to approximately 0.8.

When the phase difference is increased from 0 degrees, the efficiency of electric power reception becomes approximately 0.3 at the phase difference of approximately 45 degrees, and becomes approximately 0.1 at the phase difference of approximately 90 degrees. When the phase difference is in a range of from 90 degrees to 180 degrees, the efficiency of electric power reception is substantially constant at approximately 0.1. Hence, the efficiency of electric power reception of the power receiver 100B increases by the decrease in the efficiency of electric power reception of the power receiver 100A, and increases to approximately 0.7 when the phase difference is 90 degrees. The efficiency of electric power reception of the power receiver 100B is approximately 0.75 when the phase difference is 180 degrees.

Then, the sum of the efficiencies of electric power reception of the power receivers 100A and 100B is approximately 0.85 when the phase difference of the driving signal for driving the adjuster 130A of the power receiver 100A is 0 degrees. Even when the phase difference of the driving signal for driving the adjuster 130A of the power receiver 100A changes to approximately ±90 degrees, the sum of the efficiencies of electric power reception of the power receivers 100A and 100B are approximately 0.8 and substantially constant.

In this way, while the phase difference of the driving signal for driving the adjuster 130B of the power receiver 100B is fixed to 0 degrees, when the phase difference of the driving signal for driving the adjuster 130A of the power receiver 100A is changed from 0 degrees, the ratio of the efficiency of electric power reception of the power receiver 100A decreases, and the ratio of the efficiency of electric power reception of the power receiver 100B increases. Also, the sum of the efficiencies of electric power reception of the power receivers 100A and 100B does not change largely from a value around 0.8.

In simultaneous electric power transmission using magnetic field resonance, electric power, transmitted from the power transmitter 10 to the power receivers 100A and 100B through the magnetic field resonance, is distributed to the power receivers 100A and 100B. Therefore, even if the phase difference changes, the sum of the efficiencies of electric power reception of the power receivers 100A and 100B does not largely change.

Similarly, while the phase difference of the driving signal for driving the adjuster 130A of the power receiver 100A is fixed to 0 degrees, when the phase difference of the driving signal for driving the adjuster 130B of the power receiver 100B is decreased from 0 degrees, the ratio of the efficiency of electric power reception of the power receiver 100B decreases, and the ratio of the efficiency of electric power reception of the power receiver 100A increases. Also, the sum of the efficiencies of electric power reception of the power receivers 100A and 100B does not largely change from a value around 0.8.

Therefore, by adjusting either the phase difference of the driving signal for driving the adjuster 130A of the power receiver 100A or the phase difference of the driving signal for driving the adjuster 130B of the power receiver 100B, the ratios of the efficiencies of electric power reception of the power receivers 100A and 100B can be adjusted.

As described above, upon changing the phase difference of the driving signal for driving the switch 130A or the switch 130B, the ratios of the efficiencies of electric power reception of the secondary-side resonant coils 110A and 110B of the power receivers 100A and 100B are changed.

Hence, according to the first embodiment, one of the phase difference of the driving signal for the adjuster 130A of the power receiver 100A and the phase difference of the driving signal for the adjuster 130B of the power receiver 100B is changed from a reference phase difference. For example, a phase difference at which the efficiency of electric power reception is the maximum is defined as the reference phase difference (0 degrees), in which case, the other phase difference is changed from 0 degrees.

At this time, determination, as to whether to change the phase difference of the driving signal of the adjuster 130A from the reference phase difference or to change the phase difference of the driving signal of the adjuster 130B from the reference phase difference, is made as follows.

First, a first value, obtained by dividing the rated output of the battery 220A by the efficiency of electric power reception of the secondary-side resonant coil 110A and a second value, obtained by dividing the rated output of the battery 220B by the efficiency of electric power reception of the secondary-side resonant coil 110B, are calculated.

Then, the phase difference of the driving signal corresponding to the power receiver (100A or 100B), having the smaller value among the first value and the second value, is increased from 0 degrees to an appropriate phase difference.

The value, obtained by dividing the rated output by the efficiency of electric power reception, represents an amount of electric power (required amount of electric power transmission) to be transmitted from the power transmitter 10 to the power receiver 100A or 100B. The required amount of electric power transmission is an amount of electric power to be transmitted from the power transmitter 10 so that the power receiver (100A or 100B) receives the electric power without generating excessive electric power and insufficient electric power.

Accordingly, by reducing an amount of electric power supplied to the power receiver (100A or 100B) of which the required amount of electric power transmission is smaller, it is possible to increase an amount of electric power supplied to the power receiver (100A or 100B) of which the required amount of electric power transmission is larger. As a result, it is possible to improve the balance between the amount of electric power supplied to the power receiver 100A and the amount of electric power supplied to the power receiver 100B.

As can be seen from FIG. 11, when the phase difference of one power receiver (100A or 100B) is decreased, the amount of received electric power of the one power receiver (100A or 100B) decreases. Further, the amount of received electric power of the other power receiver (100A or 100B) increases in a state in which the phase difference of the other power receiver (100A or 100B) is fixed to 0 degrees.

Hence, by changing, from the reference phase difference (0 degrees), the phase difference of the driving signal corresponding to the power receiver (100A or 100B) of which the required amount of electric power transmission is smaller, it is possible to reduce the amount of electric power supplied to the power receiver (100A or 100B) of which the required amount of electric power transmission is smaller and to increase the amount of electric power supplied to the power receiver (100A or 100B) of which the required amount of electric power transmission is larger.

In this way, the balance of the amounts of electric power supplied to the power receivers 100A and 100B may be improved. Note that a method for setting a specific phase difference will be described later below.

Next, a method, by which the power transmitter 10 obtains data that represents an efficiency of electric power reception and a rated output from each of the power receivers 100A and 100B, will be described with reference to FIG. 12.

Figure 12:
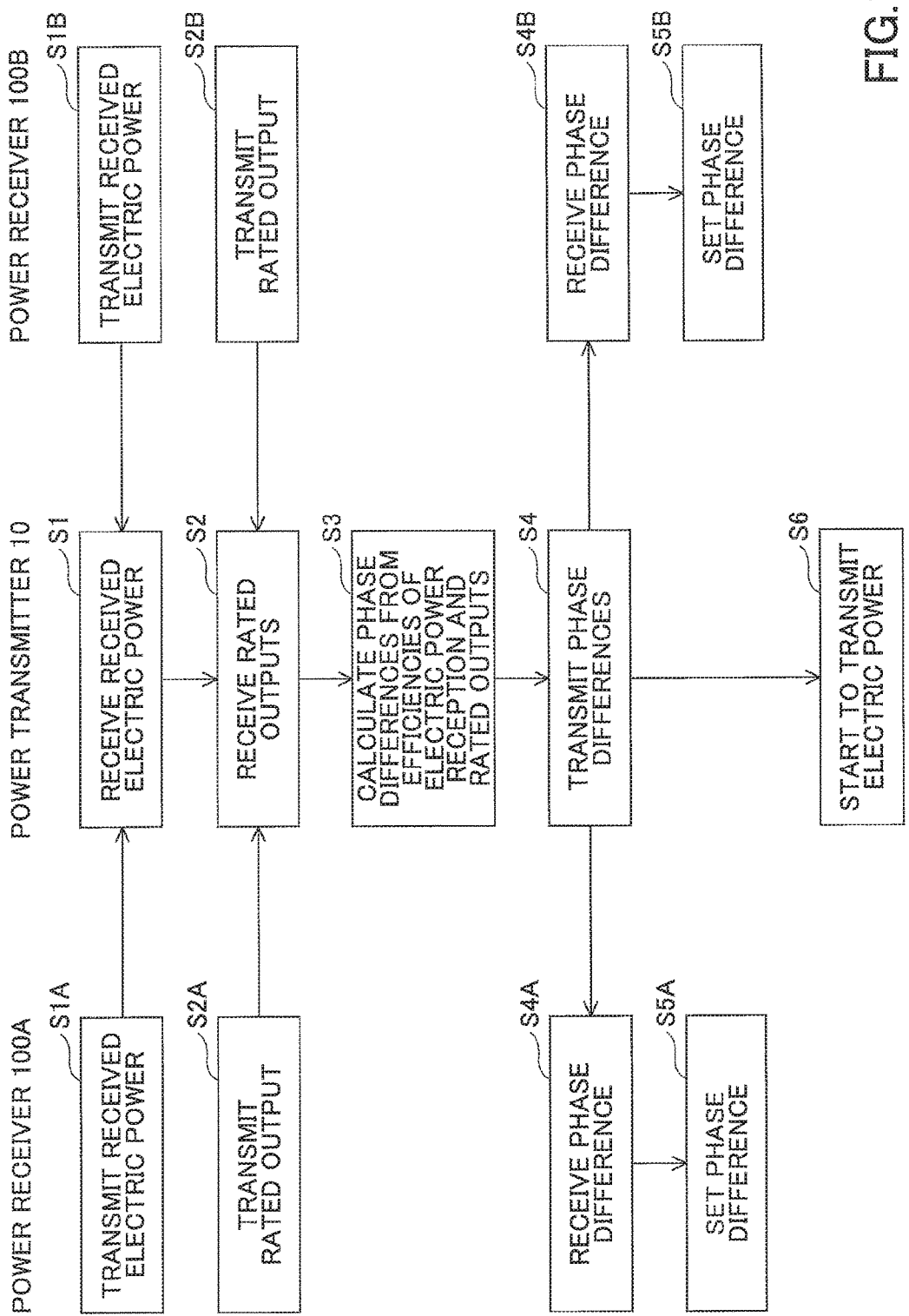
FIG. 12 is a task diagram illustrating a process that the power transmitter 10 and the power receivers 100A and 100B execute for setting the phase differences.

FIG. 12 is a task diagram illustrating a process that the power transmitter 10 and the power receivers 100A and 100B execute for setting the phase differences. This task is executed by the controllers 15, 150A and 150B (see FIG. 10).

First, the power receiver 100A transmits data, which represents received electric power, to the power transmitter 10 in step S1A. Similarly, the power receiver 100B transmits data, which represents received electric power, to the power transmitter 10 in step S1B. In this way, the power transmitter 10 receives in step S1 the data representing the received electric power from each of the power receivers 100A and 100B.

For example, in response to a request from the power transmitter 10, the controllers 150A and 150B may transmit the data, which represents the received electric power, via the antennas 170A and 170B. Further, the data representing the received electric power may include an identifier for identifying the power receivers 100A and 100B.

The data representing the received electric power may be obtained as follows. First, the power transmitter 10 wirelessly transmits a signal to the power receiver 100B to turn on both the switches (131X and 131Y of FIG. 4) of the adjuster 130B, and the power transmitter 10 wirelessly transmits a signal to the power receiver 100A to turn off both the switches of the adjuster 130A.

Here, upon turning on both of the switches of the adjuster 130B, the resonance stops occurring in the adjuster 130B, and the power receiver 100B transitions to a state of not receiving the electric power. That is, the power receiver 100B is turned off. Also, upon turning off both of the switches of the adjuster 130A, it transitions to a state where the resonance current flows in the secondary-side resonant coil 110A.

Then, predetermined electric power is transmitted from the power transmitter 10 to the power receiver 100A through magnetic field resonance, and the power receiver 100A receives the electric power. At this time, by transmitting a signal, which represents the amount of electric power received by the power receiver 100A, to the power transmitter 10, the efficiency of electric power reception of the power receiver 100A can be measured by the power transmitter 10.

Also, to measure the efficiency of electric power reception of the power receiver 100B, the power transmitter 10 wirelessly transmits a signal to the power receiver 100A to turn on both the switches of the adjuster 130A, and the power transmitter 10 wirelessly transmits a signal to the power receiver 100B to turn off both the switches of the adjuster 130B. Then, the power transmitter 10 transmits predetermined electric power to the power receiver 100B through magnetic resonance, the power receiver 100B transmits a signal representing the received power to the power transmitter 10, and consequently, the power transmitter 10 can measure the efficiency of electric power reception of the power receiver 100B.

Next, the power receiver 100A transmits data, which represents the rated output, to the power transmitter 10 in step S2A. Similarly, the power receiver 100B transmits data, which represents the rated output, to the power transmitter 10 in step S2B. In this way, the power transmitter 10 receives the data representing the rated output from each of the power receivers 100A and 100B in step S2.

For example, the data representing the rated output of the electronic device 200A may be previously stored in an internal memory of the controller 150A and the data representing the rated output of the electronic device 200B may be previously stored in an internal memory of the controller 150B. Then, the controllers 150A and 150B may transmit, to the power transmitter 10, the stored data via the antennas 170A and 170B after transmitting the data representing the efficiency of electric power reception.

Next, the power transmitter 10 calculates, based on the data representing the efficiency of electric power reception of the power receiver 100A, on the data representing the rated output, on the data representing the efficiency of electric power reception of the power receiver 100B, and on the data representing the rated output, phase differences of the driving signals corresponding to the power receivers 100A and 100B in step S3. One of the phase differences is a reference phase difference (0 degrees) at which the efficiency of electric power reception is the maximum, and the other of the phase differences is an optimized phase difference obtained by changing the reference phase difference (0 degrees). Details of step S3 will be described later below with reference to FIG. 16.

Next, the power transmitter 10 transmits the data representing the phase differences to the respective power receivers 100A and 100B in step S4. Then, the power receiver 100A receives the phase difference in step S4A and the power receiver 100B receives the phase difference in step S4B.

Here, the controller 15 of the power transmitter 10 is set to transmit, to the power receivers 100A and 100B via the antenna 16, the data representing the phase differences after calculating the phase differences.

The controller 150A of the power receiver 100A sets the phase difference for the driving signal in step S5A and the controller 150B of the power receiver 100B sets the phase difference for the driving signal in step S5B.

The power transmitter 10 starts to transmit electric power in step S6. For example, the process of step S6 may be executed when it is reported to the power transmitter 10 that the controller 150A and 150B have completed the setting of the phase differences to the driving signals, respectively.

Here, a method of obtaining the data representing the efficiencies of electric power reception of the power receivers 100A and 100B will be described with reference to FIG. 13 and FIG. 14.

Figure 13:
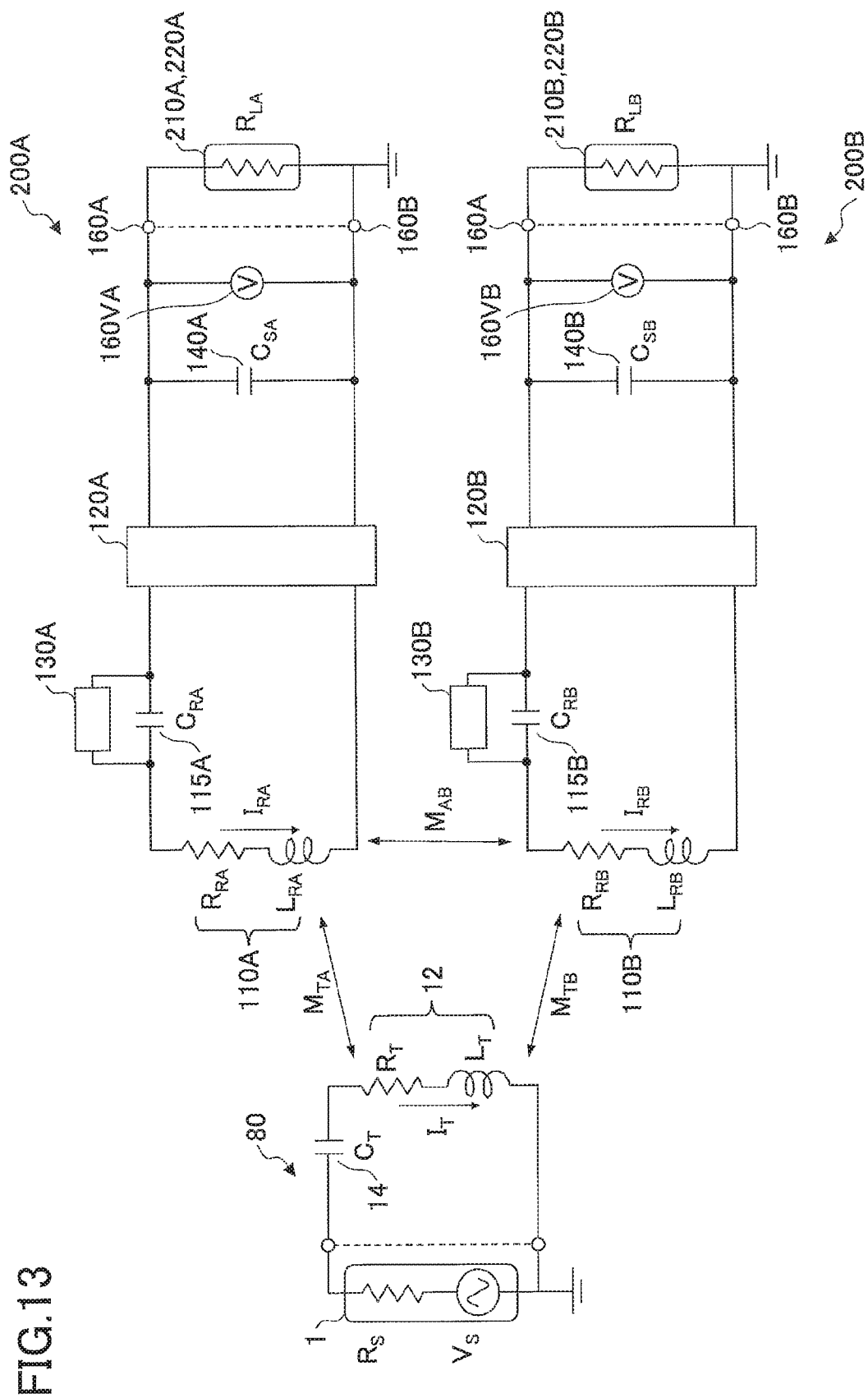
FIG. 13 is a diagram illustrating equivalent circuits of the power transmitting apparatus 80 and the electronic devices 200A and 200B.

FIG. 13 is a diagram illustrating equivalent circuits of the power transmitting apparatus 80 and the electronic devices 200A and 200B. The equivalent circuits illustrated in FIG. 13 correspond to the power transmitting apparatus 80 and the electronic devices 200A and 200B illustrated in FIG. 10. However, in the following description, the power transmitting apparatus 80 does not include a primary-side coil 11, and the primary-side resonant coil 12 is directly coupled to the AC power source 1. Further, the power receivers 100A and 100B respectively include the voltmeters 160VA and 160VB.

In FIG. 13, the secondary-side resonant coil 110A is a coil $L_{RA}$ and a resistor $R_{RA}$, and the capacitor 115A is a capacitor $C_{RA}$. Further, the smoothing capacitor 140A is a capacitor $C_{SA}$, and the DC-DC converter 210A and the battery 220A are a resistor $R_{LA}$.

Similarly, the secondary-side resonant coil 110B is a coil $L_{RB}$ and a resistor $R_{RB}$, and the capacitor 115B is a capacitor $C_{RB}$. Further, the smoothing capacitor 140B is a capacitor $C_{SB}$, and the DC-DC converter 210B and the battery 220B are a resistor $R_{LB}$.

Further, the resonant coil 12 of the power transmitting apparatus 80 is a resistor $R_T$ and a coil $L_T$, and the AC power source 1 is a power source $V_S$ and a resistor $R_S$. Further, the capacitor 14 is a capacitor $C_T$.

A mutual inductance between the power transmitting apparatus 80 and the electronic device 200A is $M_{TA}$, a mutual inductance between the power transmitting apparatus 80 and the electronic device 200B is $M_{TB}$, and a mutual inductance between the electronic device 200A and the electronic device 200B is $M_{AB}$.

Here, because the mutual inductance $M_{AB}$ is negligibly smaller than the mutual inductance $M_{TA}$ and the mutual inductance $M_{TB}$, the mutual inductance $M_{TA}$ and the mutual inductance $M_{TB}$ are discussed here.

The mutual inductance $M_{TA}$ is determined depending on the efficiency of electric power reception of the power receiver 100A of the electronic device 200A with the power transmitting apparatus 80. This is because the efficiency of electric power reception is determined depending on a position (distance) and an orientation (angle) of the power receiver 100A with respect to the power transmitting apparatus 80. Similarly, the mutual inductance $M_{TB}$ is determined depending on the efficiency of electric power reception of the power receiver 100B of the electronic device 200B with the power transmitting apparatus 80.

The efficiency of electric power reception of the power receiver 100A can be calculated by transmitting electric power from the power transmitter 10 to the power receiver 100A and measuring the amount of the electric power received by the power receiver 100A in a state of turning off the power receiver 100B. Similarly, the efficiency of electric power reception of the power receiver 100B can be calculated by transmitting electric power from the power transmitter 10 to the power receiver 100B and measuring the amount of the electric power received by the power receiver 100B in a state of turning off the power receiver 100A.

Accordingly, the mutual inductance $M_{TA}$ and the mutual inductance $M_{TB}$ can be obtained by obtaining the efficiency of electric power reception of the power receiver 100A alone and the efficiency of electric power reception of the power receiver 100B alone.

According to the first embodiment, the phase difference of the driving signal that drives the adjuster 130A or the adjuster 130B is changed in order to change the ratios of the efficiencies of electric power reception of the secondary-side resonant coils 110A and 110B of the power receivers 100A and 100B.

Hence, table data is prepared in advance that associates phase differences with relationships between mutual inductances $M_{TA}$ and mutual inductances $M_{TB}$. Then, the phase difference of the driving signal is adjusted by using such table data.

FIGS. 14A and 14B are diagrams illustrating table data that associates phase differences with relationships between mutual inductances $M_{TA}$ and mutual inductances $M_{TB}$.

FIG. 14A is table data for adjusting the phase difference of the driving signal that drives the adjuster 130A in a state in which the phase difference of the driving signal that drives the adjuster 130B is fixed to 0 degrees.

Mutual inductances $M_{TA}1$, $M_m2$, $M_{TA}3$, ... take specific values of mutual inductance $M_{TA}$ in practice. Similarly, mutual inductances $M_{TB}1$, $M_{TB}2$, $M_{TB}3$, ... take specific values of mutual inductance $M_{TB}$ in practice. Phase differences PD1A, PD2A, PD3A, ... PD11A, PD12A, PD13A, ... take specific values of phase difference obtained by simulation or experimentally.

FIG. 14B is table data for adjusting the phase difference of the driving signal that drives the adjuster 130B in a state in which the phase difference of the driving signal that drives the adjuster 130A is fixed to 0 degrees.

Mutual inductances $M_{TA}1$, $M_m2$, $M_{TA}3$, ... and mutual inductances $M_{TB}1$, $M_{TB}2$, $M_{TB}3$, ... are similar to those of FIG. 14A. Phase differences PD1B, PD2B, PD3B, ... PD11B, PD12B, PD13B, ... take specific values of phase difference obtained by simulation or experimentally.

The table data illustrated in FIGS. 14A and 14B can be created by experimentally trying to optimize the phase differences with measuring of the mutual inductances $M_{TA}$ and $M_{TB}$ while positions and orientations of the power receivers 100A and 100B with respect to the power transmitter 10 are variously changed.

FIGS. 15A and 15B are diagrams illustrating table data that associates efficiencies of electric power reception with mutual inductances $M_{TA}$ and $M_{TB}$. FIG. 15A is table data that associates respective mutual inductances $M_{TA}$ with efficiencies of electric power reception of the power receiver 100A. FIG. 15B is table data that associates respective mutual inductances $M_{TB}$ with efficiencies of electric power reception of the power receiver 100B.

The mutual inductances $M_{TA}$ and $M_{TB}$ are respectively determined depending on the efficiencies $E_A$ and $E_A$ of electric power reception between the power transmitting apparatus 80 and the power receivers 100A and 100B.

In FIG. 15A, the mutual inductances $M_{TA1}$, $M_{TA2}$, ... are associated with the efficiencies $E_{A1}$, $E_{A2}$, ... of electric power reception of the power receiver 100A. Also, in FIG. 15B, the mutual inductances $M_{TB1}$, $M_{TB2}$, ... are associated with the efficiencies $E_{B1}$ $E_{B2}$, ... of electric power reception of the power receiver 100B.

By previously measuring the efficiencies of electric power reception and the mutual inductances $M_{TA}$ and $M_{TB}$ of the power receivers 100A and 100B through experiments or the like to create table data as illustrated in FIGS. 15A and 15B, the mutual inductances $M_{TA}$ and $M_{TB}$ of the power receivers 100A and 100B can be obtained from the efficiencies of electric power reception of the power receivers 100A and 100B. Alternatively, through a simulation, the mutual inductances $M_{TA}$ and $M_{TB}$ of the power receivers 100A and 100B can be obtained from the efficiencies of electric power reception of the power receivers 100A and 100B.

Next, a method of setting the phase difference will be described with reference to FIG. 16.

FIG. 16 is a flowchart illustrating a method by which the power transmitter 10 sets the phase difference of the power receiver 100A or 100B according to the first embodiment. This flow illustrates a process that is executed by the controller 15 of the power transmitter 10 and illustrates details of the process of step S3 of FIG. 12.

The controller 15 starts a process illustrated in FIG. 16, upon proceeding to step S3 by receiving from the power receivers 100A and 100B the signals that represent the received electric power to obtain the efficiencies of electric power reception and receiving from the power receivers 100A and 100B the signals that represent the rated outputs.

The controller 15 calculates a first value, obtained by dividing the rated output of the battery 220A by the efficiency of electric power reception of the secondary-side resonant coil 110A and calculates a second value, obtained by dividing the rated output of the battery 220B by the efficiency of electric power reception of the secondary-side resonant coil 110B, and determines whether the first value is greater than the second value in step S31.

Upon determining that the first value is greater than the second value (YES in step S31), the controller 15 sets the phase difference of the driving signal that drives the adjuster 130A of the power receiver 100A to be 0 degrees in step S31A.

Next, the controller 15 sets a phase difference of the driving signal that drives the adjuster 130B of the power receiver 100B in step S32A. Specifically, based on the table data illustrated in FIGS. 15A and 15B, the controller 15 obtains the mutual inductances $M_{TA}$ and $M_{TB}$ of the power receivers 100A and 100B from the efficiencies $E_A$ and $E_B$ of electric power reception of the power receivers 100A and 100B respectively. Then, from the table data illustrated in FIG. 14B, the controller 15 obtains the phase difference of the driving signal that drives the adjuster 130B of the power receiver 100B based on the mutual inductances $M_{TA}$ and $M_{TB}$ of the power receivers 100A and 100B.

When the process of step S32A is completed, the controller 15 causes the flow to proceed to step S4 (see FIG. 12).

Upon determining that the first value is less than the second value (NO in step S31), the controller 15 sets the phase difference of the driving signal that drives the adjuster 130B of the power receiver 100B to be 0 degrees in step S31B.

Next, the controller 15 sets a phase difference of the driving signal that drives the adjuster 130A of the power receiver 100A in step S32B. Specifically, based on the table data illustrated in FIGS. 15A and 15B, the controller 15 obtains the mutual inductances $M_{TA}$ and $M_{TB}$ of the power receivers 100A and 100B from the efficiencies $E_A$ and $E_B$ of electric power reception of the power receivers 100A and 100B respectively. Then, from the table data illustrated in FIG. 14A, the controller 15 obtains the phase difference of the driving signal that drives the adjuster 130A of the power receiver 100A based on the mutual inductances $M_{TA}$ and $M_{TB}$ of the power receivers 100A and 100B.

When the process of step S32B is completed, the controller 15 causes the flow to proceed to step S4 (see FIG. 13).

In this way, the controller 15 sets the phase differences of the driving signals for driving the adjusters 130A and 130B of the power receivers 100A and 100B.

As described above, according to the first embodiment, the required amount of electric power to be transmitted to the power receiver 100A and the required amount of electric power to be transmitted to the power receiver 100B are obtained by the efficiencies of electric power reception of the secondary-side resonant coils 110A and 110B of the power receivers 100A and 100B and the rated outputs of the electronic devices 200A and 200B.

Then, the phase difference of the driving signal corresponding to the power receiver (100A or 100B) of which the required amount of electric power transmission is smaller among the power receivers 100A and 100B is changed from the reference phase difference.

As a result, the amount of electric power supplied to the power receiver (100A or 100B) of which the required amount of electric power transmission is smaller is reduced and it is possible to increase the amount of electric power supplied to the power receiver (100A or 100B) of which the required amount of electric power transmission is larger.

In this way, the balance between the amount of electric power supplied to the power receiver 100A and the amount of electric power supplied to the power receiver 100B is improved.

Thus, according to the first embodiment, it is possible to provide the power receiver 100A or 100B that can improve the balance of supplied amounts of electric power. Further, according to the first embodiment, it is possible to provide the power transmitting system 500 that can improve the balance of supply amounts of electric power.

Further, the power receiver 100 according to the first embodiment includes the capacitor 135 coupled in series with the switches 131X and 131Y of the adjuster 130. The capacitor 135 is coupled in series with the capacitor 133X and 133Y.

Hence, it is possible to reduce the capacitance of the adjuster 130 relative to a case where the adjuster 130 does not include the capacitor 135. When the power receiver 100 uses the clock signals CLK1 and CLK2 to drive the switches 131X and 131Y for receiving electric power from the power transmitter 10, as described with reference to FIG. 6, the capacitor 135 and one of the capacitors 133X and 133Y are included in the electric current path.

Accordingly, when the capacitance of the capacitor 135 is equal to the capacitance of the capacitors 133X and 133Y, the combined capacitance of the capacitor 135 and one of the capacitors 133X and 133Y is equal to half of the capacitance of the capacitors 133X and 133Y.

When the power receiver 100 operates at the resonance point, an electric current, which flows in the secondary-side resonant coil, flows in both the capacitor 115 and the adjuster 130. Inside the adjuster 130, the electric current flows through the switch 131X and the capacitor 133Y or the switch 131Y and the capacitor 133X, and the capacitor 135.

Here, the ratio of the electric current flowing in the capacitor 115 to the electric current flowing in the adjuster 130 is substantially equal to the ratio of the capacitance of the capacitor 115 to the capacitance of one of the capacitors 133X and 133Y. Here, the combined impedance Z of the capacitor 115 and the adjuster 130 is obtained by the following formula (1) where the capacitance of the capacitor 115 is $C_1$, the capacitance of one of the capacitors 133X and 133Y is $C_2$, and the resistance value of one of the capacitors 133X and 133Y is R. Note that ω represents the angular frequency.

$$Z = \frac{1}{j\omega C_1 + \frac{j\omega C_2}{1 + j\omega C_2 \cdot R}} \approx \frac{1}{j\omega C_1 + j\omega C_2} \quad (1)$$

Here, the electric current $I_1$ that flows in the capacitor 115 and the electric current $I_2$ that flows in the adjuster 130 are expressed by the following formula (2) where voltage V is applied to both ends of the adjuster 130 and the capacitor 115. The electric current that flows in the secondary-side resonant coil 110 is branched off into the electric current $I_1$ and the electric current $I_2$.

$$I_1 = V \cdot j\omega C_1, I_2 = V \cdot j\omega C_2 \quad (2)$$

Accordingly, $I_1:I_2=C_1:C_2$. That is, the ratio of the electric current flowing in the capacitor 115 to the electric current flowing in the adjuster 130 is substantially equal to the ratio of the capacitance of the capacitor 115 to the capacitance of one of the capacitors 133X and 133Y.

Accordingly, reducing a power loss generated in the adjuster 130 by decreasing the combined capacitance of the adjuster 130 contributes to improving the efficiency of electric power reception of the power receiver 100. As described above, in a case where the capacitance of the adjuster 130 can be reduced to half by adding the capacitor 135, the power loss may be reduced to one-quarter.

In particular, in a case where the switch 131X, the diode 132X, and the capacitor 133X are realized by a single FET, because there is an on-resistance of the FET, reducing the impedance of the adjustor 130 decreases the loss at the FET and is very effective.

Further, the same applies to a case where the switch 131Y, the diode 132Y, and the capacitor 133Y are realized by a single FET.

Accordingly, by using the adjuster 130 including the capacitor 135 coupled in series with the capacitors 133X and 133Y, the power loss can be reduced relative to a case where the adjuster 130 does not include the capacitor 135.

Note that in a case where the switch 131X, the diode 132X, with the capacitor 133X, and the switch 131Y, the diode 132Y, and the capacitor 133Y are respectively realized by FETs, the capacitor 135 may be a capacitor chip, or may be a capacitor included in a semiconductor chip that is the same as an FET, for example.

Further, in the above described embodiment, the balance between the amount of electric power supplied to the power receiver 100A and the amount of electric power supplied to the power receiver 100B is improved by changing the phase difference of the driving signal corresponding to the power receiver (100A or 100B) of which the required amount of electric power transmission is smaller among the power receivers 100A and 100B.

However, there may be a case where three or more power receivers are charged at the same time. In such a case, phase differences of driving signals of power receivers other than a power receiver of which the required amount of electric power is largest, among amounts of electric power obtained by dividing respective rated outputs by efficiencies of electric power reception, may be changed.

Further, in the above embodiment described as an example, each of the electronic devices 200A and 200B is a terminal device such as a tablet computer or a smartphone. However, each of the electronic devices 200A and 200B may be any electronic device that includes a chargeable battery such as a note Personal Computer (PC), a portable phone terminal, a portable game machine, a digital camera, or a video camera, for example.

Further, in the embodiment described above, the phase differences are obtained depending on the efficiencies of electric power reception and rated outputs of the two power receivers 100A and 100B, and the controller 150A or 150B adjusts the phase difference of the driving signal for driving the switches 131X and 131Y.

However, in a case where electric power is transmitted between a single power transmitter 10 and a single power receiver 100 (see FIG. 4), the controller 150 of the power receiver 100 may drive the switches 131X and 131Y by using a phase difference obtained in advance through an experiment or the like. In this case, it is not necessary to store data representing the rated output of the battery 220 in an internal memory of the controller 150.

Also, in the case where electric power is transmitted between a single power transmitter 10 and a single power receiver 100 (see FIG. 4), the controller 150 of the power receiver 100 may adjust the phase difference of the clock signals CLK1 and CLK2 to adjust the received electric power. In this case, it is not necessary to detect the phase difference that maximizes the electric power received by the power receiver 100.

Further, in the above description of the embodiment, the power receivers 100A and 100B simultaneously charge the batteries 220A and 220B. However, the electronic devices 200A and 200B may operate to directly consume electric power, received by the power receivers 100A and 100B, without including the batteries 220A and 220B. Even in the case where the electronic devices 200A and 200B do not include the batteries 220A and 220B, it is possible to drive the electronic devices 200A and 200B at the same time because the power receivers 100A and 100B can receive electric power simultaneously and effectively. This is one merit of the case of simultaneously receiving electric power because this is impossible in a case of receiving electric power in a time-division manner. In such a case, phase differences may be set by using rated outputs required for driving the electronic devices 200A and 200B.

Also, so far, the embodiment has been described in which the controller 15 of the power transmitter 10 generates the driving signals to be transmitted to the power receivers 100A and 100B. However, the power transmitter 10 may transmit data representing transmission power of the power transmitter 10 to the power receivers 100A and 100B, and the power receivers 100A and 100B may generate the driving signals, respectively. In this case, the power receivers 100A and 100B may execute data communication with each other to determine which of the power receivers 100A and 100B has greater electric power to be received so that at least one of the power receivers 100A and 100B generates a driving signal to increase the phase difference of the driving signal of the power receiver 100A or 100B having the smaller power to be received.

Alternatively, the power transmitter 10 may receive the data representing the received electric power and the rated output from each of the power receivers 100A and 100B, to cause the controller 150A or 150B of the power receiver 100A or 100B, of which the required amount of electric power transmission is smaller, to adjust the phase difference. In this case, the controller 150A or 150B may store the data required for adjusting the phase difference in an internal memory.

In the embodiment described above, the capacitor 135 is inserted in series between the terminal 134X and the connection point 136. However, the position at which the capacitor 135 is provided is not limited to this.

Figure 17A:
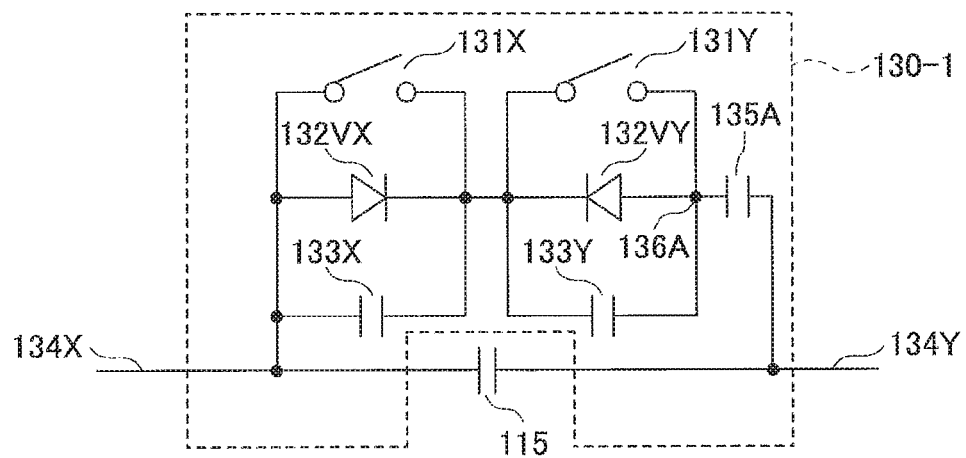
FIGS. 17A and 17B are diagrams illustrating adjusters 130-1 and 130-2 according to variation examples of the first embodiment.
Figure 17B:
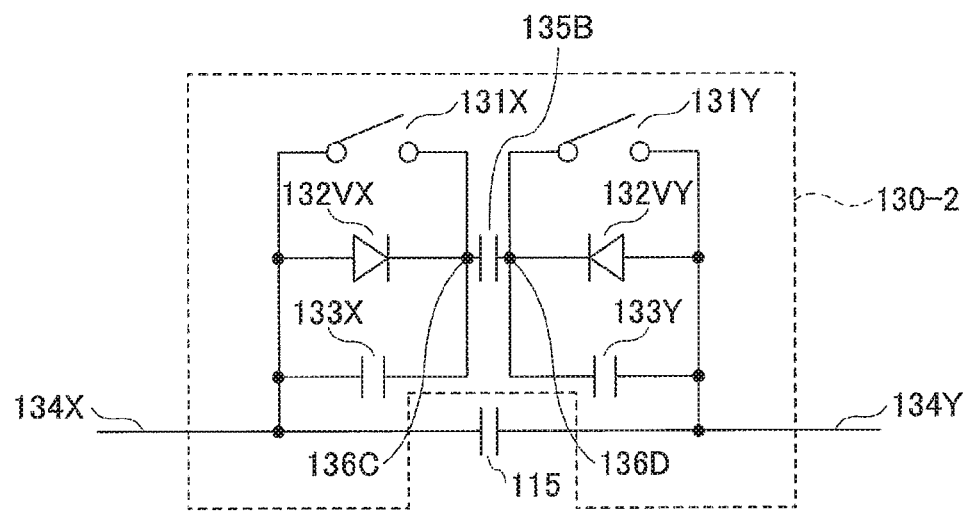

FIGS. 17A and 17B are diagrams illustrating adjusters 130-1 and 130-2 according to variation examples of the first embodiment.

The adjuster 130-1 illustrated in FIG. 17A includes the switches 131X and 131Y, the diodes 132VX and 132VY, the capacitors 133X and 133Y, the terminals 134X and 134Y, and a capacitor 135A.

The capacitor 135A is inserted in series between a connection point 136A, of the right side terminal of the switch 131Y, of the anode of the diode 132VY, and of the right side terminal of the capacitor 133Y, and the terminal 134Y.

The characteristics of the phase difference and the efficiency in a case of using such an adjuster 130-1 are equal to the characteristics illustrated in FIG. 8. This is because the impedance of the adjuster 130-1 is equal to the impedance of the adjuster 130 (see FIG. 4). Hence, the phase difference may be adjusted, in a range where the phase difference is negative, between the phase difference at which the efficiency is the maximum and the phase difference at which the efficiency is the minimum.

The adjuster 130-2 illustrated in FIG. 17B includes the switches 131X and 131Y, the diodes 132VX and 132VY, the capacitors 133X and 133Y, the terminals 134X and 134Y, and a capacitor 135B.

The capacitor 135B is inserted in series between a connection point 136C, of the right side terminal of the switch 131X, of the cathode of the diode 132VX, and of the right side terminal of the capacitor 133X, and a connection point 136D, of the left side terminal of the switch 131Y, of the cathode of the diode 132VY, and of the left side terminal of the capacitor 133Y.

The characteristics of the phase difference and the efficiency in a case of using such an adjuster 130-2 are equal to the characteristics illustrated in FIG. 8. This is because the impedance of the adjuster 130-2 is equal to the impedance of the adjuster 130 (see FIG. 4). Hence, the phase difference may be adjusted, in a range where the phase difference is negative, between the phase difference at which the efficiency is the maximum and the phase difference at which the efficiency is the minimum.

Further, the capacitor 135B illustrated in FIG. 17B may be added to the adjuster 130 illustrated in FIG. 4 in addition to the capacitor 135, and the capacitor 135B illustrated in FIG. 17B may be added to the adjuster 130-1 illustrated in FIG. 17A. In such a case, the resonant conditions may be set by also taking into consideration the capacitance of the capacitor 135B.

Figure 18:
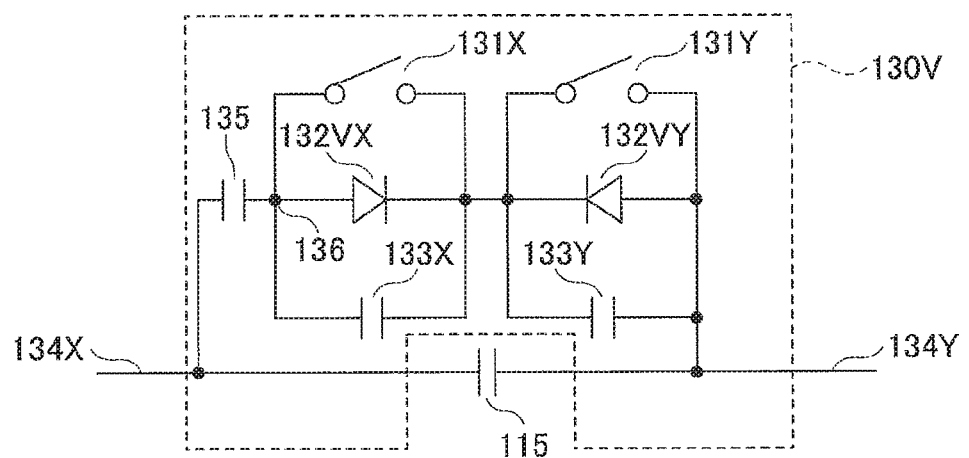
FIG. 18 is a diagram illustrating an adjuster 130V according to a variation example of the first embodiment.

Also, the directions of the diodes 132X and 132Y of the adjuster 130 may be opposite to the directions illustrated in FIG. 4. FIG. 18 is a diagram illustrating an adjuster 130V according to a variation example of the first embodiment.

The adjuster 130V includes switches 131X and 131Y, diodes 132VX and 132VY, capacitors 133X and 133Y, terminals 134X and 134Y, and a capacitor 135. The rectification directions of the diode 132VX and 132VY are opposite to those of the diodes 132X and 132Y illustrated in FIG. 4, respectively. Other than this, the adjuster 130V is similar to the adjuster 130 illustrated in FIG. 4. Therefore, the same reference numerals are assigned to the same components, and their descriptions are omitted.

The characteristics of the phase difference and the efficiency in a case of using the diodes 132VX and 132VY inverting the rectification directions are equal to the characteristics illustrated in FIG. 8.

Figure 19:
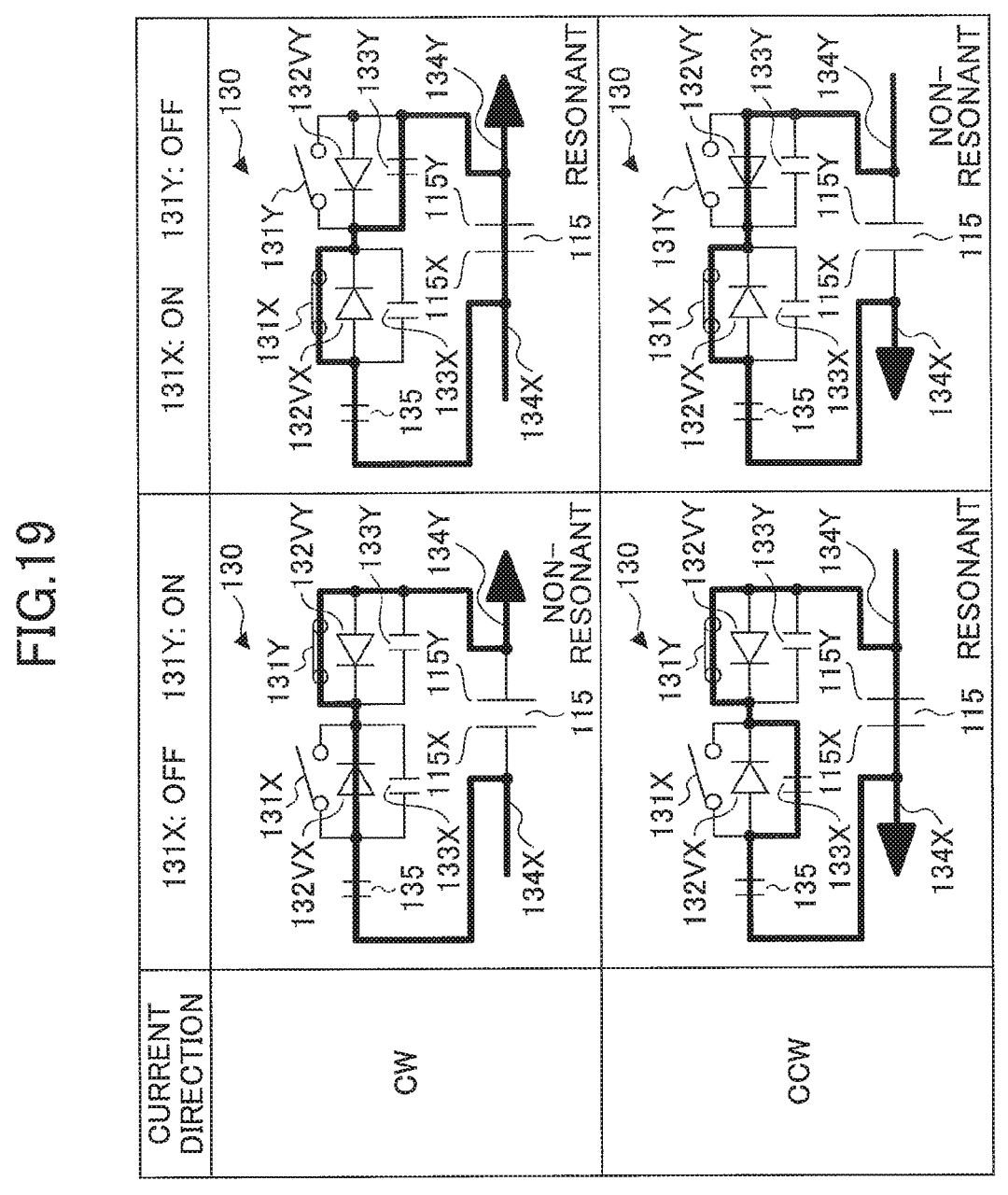

FIG. 19 is a diagram illustrating current paths in the capacitor 115 and the adjuster 130V. In FIG. 19, an electric current direction will be referred to as the clockwise (CW) direction for an electric current flowing from the terminal 134X to the terminal 134Y through the capacitor 115 or the inside of the adjuster 130V. Also, an electric current direction will be referred to as the counterclockwise (CCW) direction for an electric current flowing from the terminal 134Y to the terminal 134X through the capacitor 115 or the inside of the adjuster 130V.

When the switch 131X is off, the switch 131Y is on, and an electric current flows clockwise (CW), the current path generated in the adjuster 130V goes from the terminal 134X to the terminal 134Y through the capacitor 135, the diode 132VX, and the switch 131Y. Because this electric current path is parallel with the capacitor 115, the current stops flowing in the capacitor 115. Therefore, the resonance current does not flow in the secondary-side resonant coil 110.

When the switch 131X is off, the switch 131Y is on, and an electric current flows counterclockwise (CCW), a resonance current flows in the adjuster 130V in the direction from the terminal 134Y to the terminal 134X through the switch 131Y, the capacitor 133X, and the capacitor 135, and the resonance current flows in the capacitor 115 from the terminal 115Y to the terminal 115X. Therefore, the resonance current flows in the secondary-side resonant coil 110 in the counterclockwise direction.

When the switch 131X is on, the switch 131Y is off, and an electric current flows clockwise (CW), a resonance current flows in the adjuster 130V in the direction from the terminal 134X to the terminal 134Y through the capacitor 135, the switch 131X, and the capacitor 133Y, and the resonance current flows in the capacitor 115 from the terminal 115X to the terminal 115Y. Therefore, the resonance current flows in the secondary-side resonant coil 110 in the clockwise direction.

When the switch 131X is on, the switch 131Y is off, and an electric current flows counterclockwise (CCW), the current path generated in the adjuster 130V goes from the terminal 134Y to the terminal 134X through the diode 132VY, the switch 131X, and the capacitor 135. Since this electric current path is parallel with the capacitor 115, the electric current stops flowing in the capacitor 115. Therefore, the resonance current does not flow in the secondary-side resonant coil 110.

Second Embodiment

Figure 20:
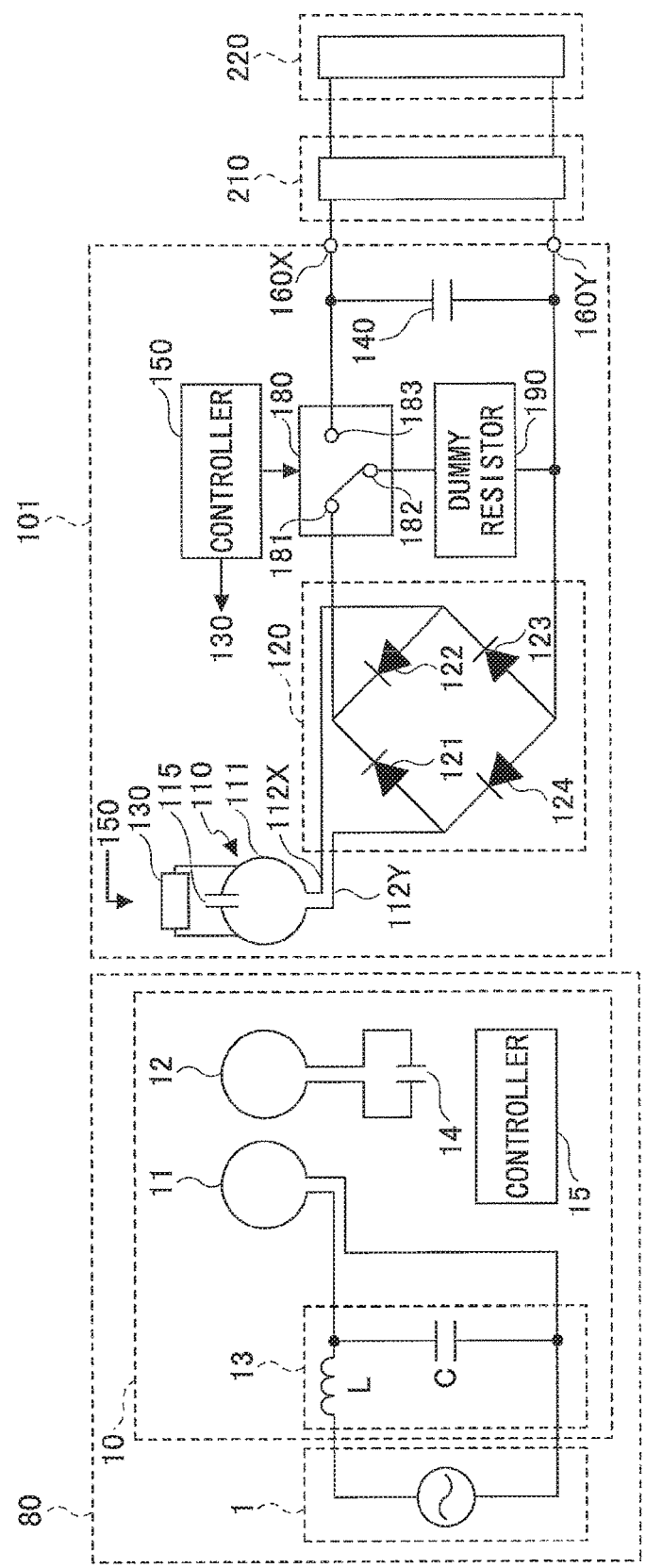
FIG. 20 is a diagram illustrating a power transmitting apparatus 80 and a power receiver 101 according to a second embodiment.

FIG. 20 is a diagram illustrating a power transmitting apparatus 80 and a power receiver 101 according to a second embodiment. The power transmitting apparatus 80 is equivalent to that illustrated in FIG. 4.

The power receiver 101 has a configuration in which a switch 180 and a dummy resistor 190 are added to the power receiver 100 (refer to FIG. 4) of the first embodiment. Because other configurations are equivalent to those of the power receiver 100, the same numerals are given to the equivalent configuration elements and their descriptions are omitted.

The switch 180 is a switch that includes three terminals 181, 182, and 183. The terminals 181, 182, and 183 are respectively coupled to an output terminal on a higher voltage side (upper side in FIG. 20) of the rectifier circuit 120, an upper side terminal of the dummy resistor 190, and an upper side terminal of the smoothing capacitor 140.

The switch 180 is driven by the controller 150 to switch a coupling destination of the terminal 181 to either the terminal 182 or the terminal 183. That is, the switch 180 switches the coupling destination of the output terminal on the higher voltage side of the rectifier circuit 120 to either the upper side terminal of the dummy resistor 190 or the upper side terminal of the smoothing capacitor 140.

The dummy resistor 190 is coupled between the terminal 182 of the switch 180 and a lower voltage side line, which couples a lower side terminal of the smoothing capacitor 140 and the output terminal 160Y. The dummy resistor 190 is a resistor that has impedance equal to impedance of the battery 220.

The dummy resistor 190 is provided to be used instead of the battery 220 when an efficiency of electric power reception of the power receiver 101 is measured. This is because the efficiency of electric power reception can be measured through smaller electric power consumption by causing an electric current to flow through the dummy resistor 190 having the impedance (resistance value) equal to that of the battery 220 to measure the efficiency of electric power reception, than by measuring the efficiency of electric power reception through charging the battery 220.

Using the efficiency of electric power reception measured by using the dummy resistor 190, the power receiver 101 according to the second embodiment determines a phase difference of the driving signal that drives the adjuster 130 of the power receiver 101.

Note that the switch 180 may be inserted, between the rectifier circuit 120 and the smoothing capacitor 140, on a lower voltage side line that couples the lower side terminal of the smoothing capacitor 140 and the output terminal 160Y. In this case, the dummy resistor 190 may be coupled between the switch 180 and the higher voltage side line that couples the upper side terminal of the smoothing capacitor 140 and the output terminal 160X.

In the following, data that represents received electric power, a rated output, a phase difference or the like is communicated between the controller 15 of the power transmitter 10 and the controllers 150A and 150B of the power receivers 101A and 101B. The communications between the controllers 150A and 150B and the controller 15 are performed between the antennas 170A and 170B and the antenna 16 (see FIG. 10).

Figure 21:
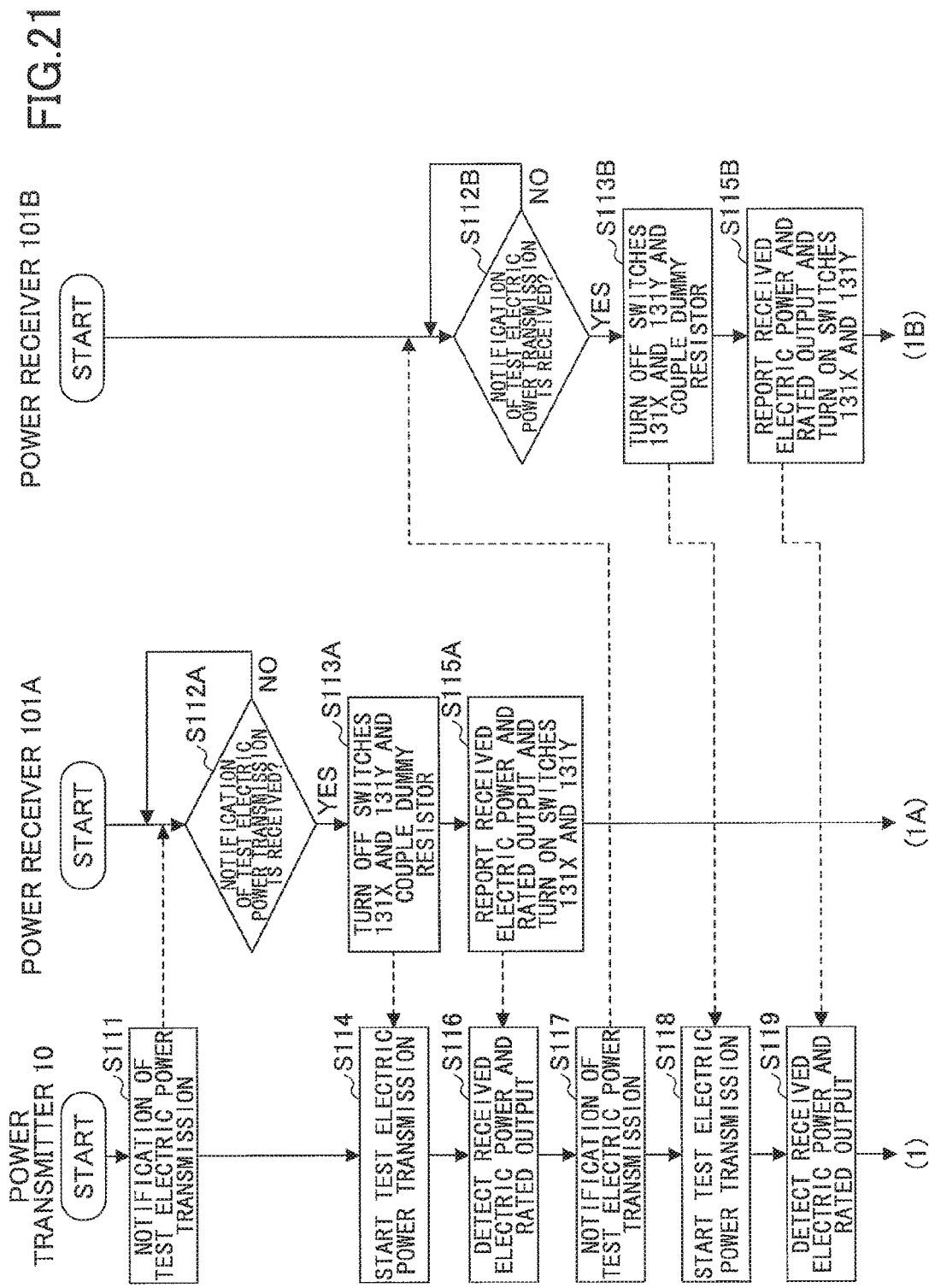
FIG. 21 is a task diagram illustrating a process that the power transmitter 10 and power receivers 101A and 101B according to the second embodiment execute for setting the phase differences.
Figure 22:
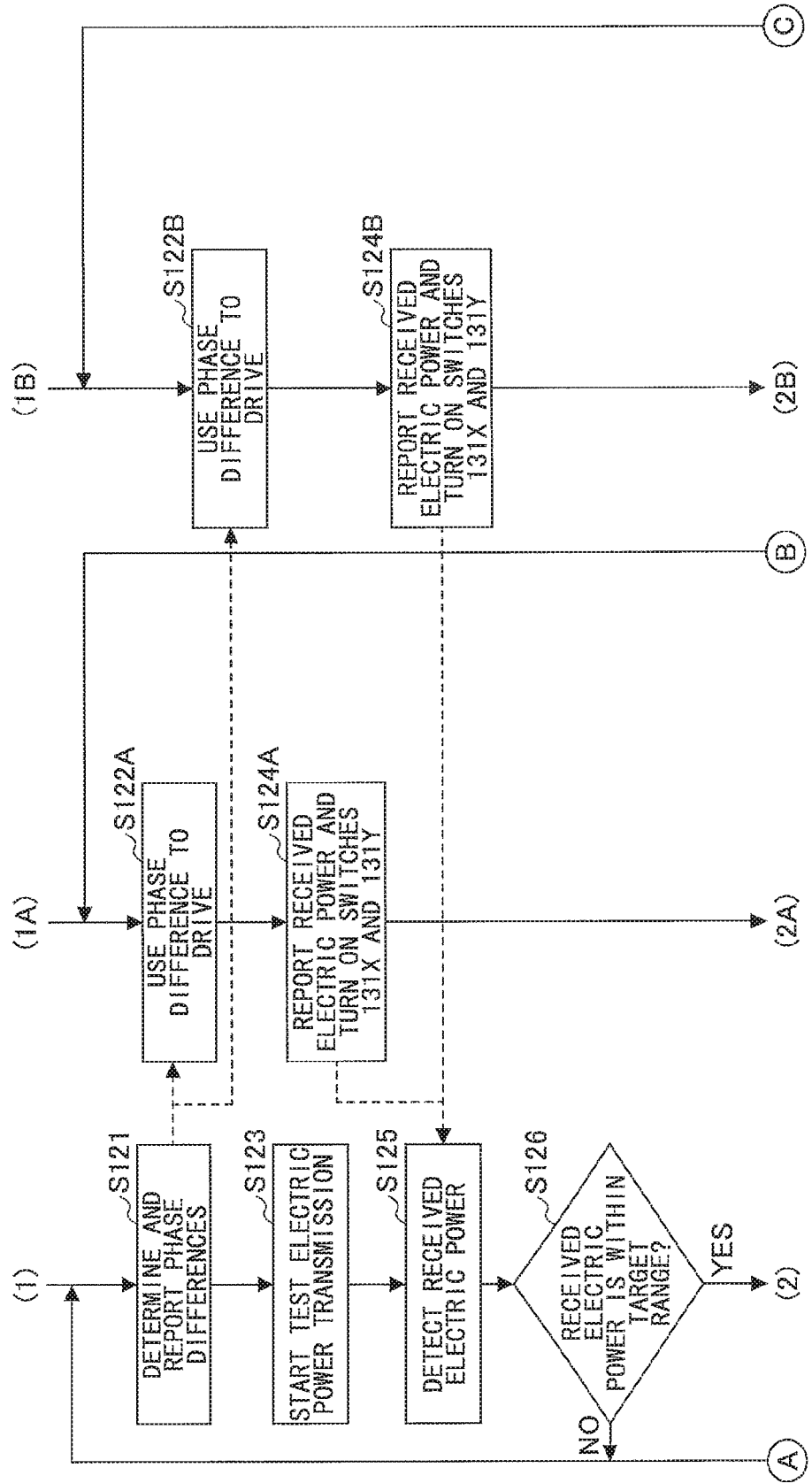
FIG. 22 is a task diagram illustrating a process that the power transmitter 10 and the power receivers 101A and 101B according to the second embodiment execute for setting the phase differences.
Figure 23:
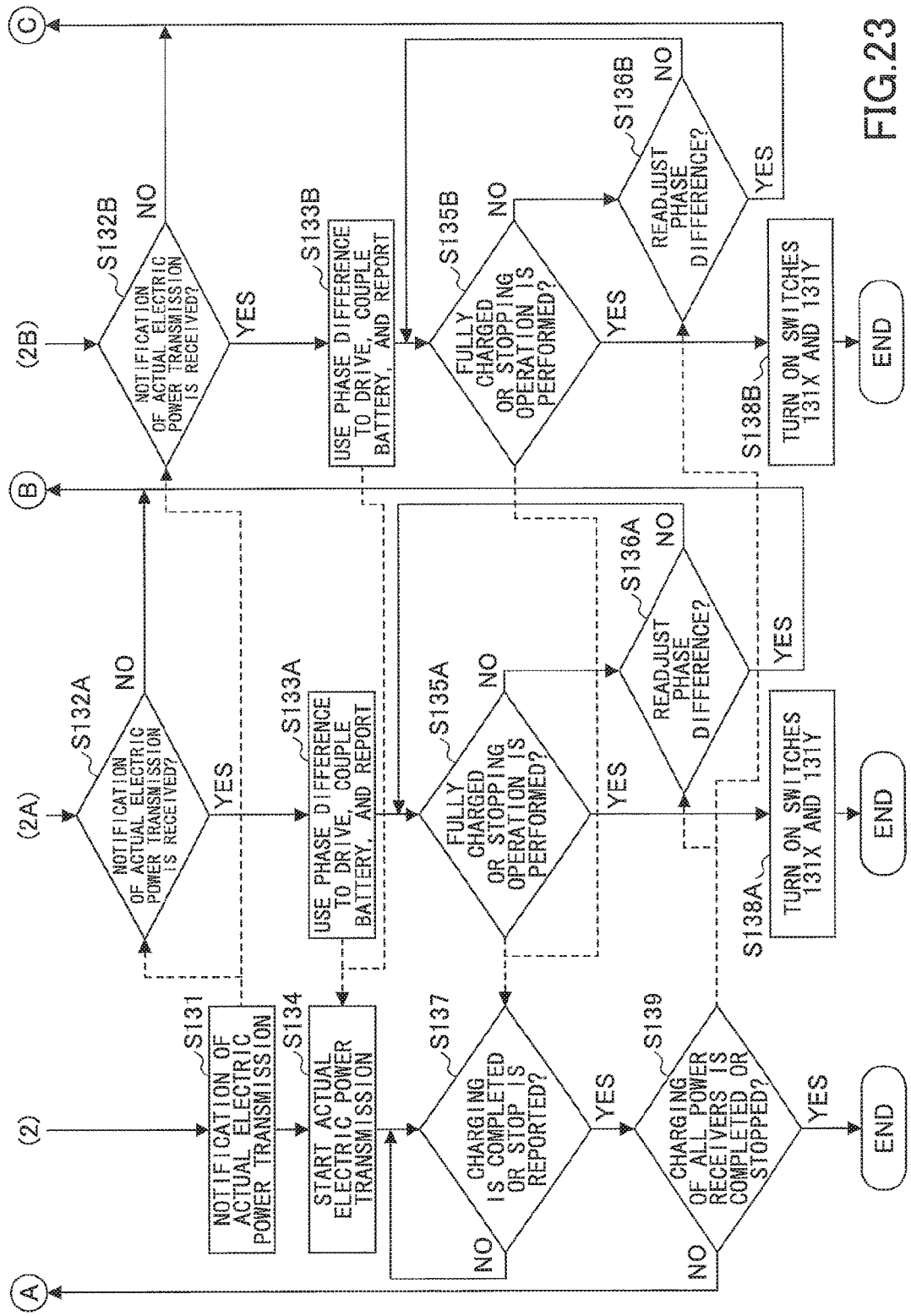
FIG. 23 is a task diagram illustrating a process that the power transmitter 10 and the power receivers 101A and 101B according to the second embodiment execute for setting the phase differences.

FIG. 21 to FIG. 23 are task diagrams illustrating a process that the power transmitter 10 and power receivers 101A and 101B according to the second embodiment execute for setting the phase differences of the driving signals.

Each of the power receivers 101A and 101B has a configuration equivalent to that of the power receiver 101 illustrated in FIG. 20. Further, similar to the power receivers 100A and 100B of the first embodiment illustrated in FIG. 10, each of the power receivers 101A and 101B receives electric power from the single power transmitter 10. Here, they are referred to as the power receivers 101A and the power receiver 101B in order to distinguish the two power receivers 101.

It is assumed in the following description that the power receiver 101A includes a secondary-side resonant coil 110A, a capacitor 115A, a rectifier circuit 120A, an adjuster 130A, a smoothing capacitor 140A, a controller 150A, a switch 180A, and a dummy resistor 190A. A DC-DC converter 210A and a battery 220A are coupled to the power receiver 101A (see FIG. 10).

Similarly, it is assumed in the following description that the power receiver 101B includes a secondary-side resonant coil 110B, a capacitor 115B, a rectifier circuit 120B, an adjuster 130B, a smoothing capacitor 140B, a controller 150B, a switch 180B, and a dummy resistor 190B. A DC-DC converter 210B and a battery 220B are coupled to the power receiver 101B (see FIG. 10).

Although the process illustrated in FIG. 21 to FIG. 23 is executed by the controller 15 of the power transmitter 10 (see FIG. 20) and the controllers 150 of the power receivers 101A and 101B (see FIG. 20), the power transmitter 10 and the power receivers 101A and 101B are taken as performing the process in the following description.

The power receivers 101A and 101B and the power transmitter 10 start preparation for electric power transmission (START). For example, the preparation for electric power transmission may be started by setting the power transmitter 10 and the power receivers 101A and 101B to a predetermined preparatory mode and by reporting a request from the power receivers 101A and 101B to the power transmitter 10 for electric power transmission.

Here, the adjuster 130A of the power receiver 101 and the adjuster 130B of the power receiver 101B are turned off (the switches 131X and 131Y are turned on) unless otherwise controlled specifically. When the switches 130A and 130B are off, it is a state (resonance off state) in which resonance through magnetic field resonance is not generated in the power receivers 101A and 101B.

First, the power transmitter 10 transmits, to the power receiver 101A in step S111, a notification of test electric power transmission. Here, it is assumed that the power receiver 101A reports an electric power transmission request to the power transmitter 10 before the power receiver 101B reports an electric power transmission request to the power transmitter 10. In step S111, the power transmitter 10 transmits, to the power receiver 101A that has reported the power transmission request earliest, the notification of test electric power transmission. Note that the power transmitter 10 identifies the power receiver 101A or 101B by using an identifier or the like for identifying the power receiver 101A or 101B.

The power receiver 101A determines in step S112A whether a notification of test electric power transmission is received from the power transmitter 10. Note that the power receiver 101A repeatedly executes the process of step S112A until receiving the notification of test electric power transmission from the power transmitter 10.

The power receiver 101A turns off the switches 131X and 131Y of the adjuster 130A and switches the coupling destination of the switch 180A to the dummy resistor 190A in step 113A. Upon turning off the switches 131X and 131Y of the adjuster 130A, the power receiver 101A transitions to a state where a resonance current flows in the secondary-side resonant coil 110A over the entire period of one cycle of resonance through magnetic resonance. Upon completing the process of step S113A, the power receiver 101A reports the completion to the power transmitter 10.

The power transmitter 10 starts test electric power transmission in step S114. In this way, the power receiver 101A starts to receive the electric power.

The power receiver 101A controls the amount of shift in the phase shift circuit 153 of the controller 150A to adjust the phase of the two clock signals CLK1 and CLK2, and to detect the reference phase in which the maximum efficiency of electric power reception is obtained. Then, the power receiver 101A reports the received electric power representing the electric power received from the power transmitter 10 in the reference phase, and the rated output of the battery 220A to the power transmitter 10, and turns on the switches 131X and 131Y of the adjuster 130A in step S115A. In this way, the received electric power that the power receiver 101A reports to the power transmitter 10 is measured in the reference phase, and hence, is the maximum received electric power that can be received by the power receiver 101A.

When the switches 131X and 131Y of the adjuster 130A are turned on, the power receiver 101A enters a state in which resonance due to magnetic field resonance is not generated even if receiving electric power. That is, it enters a state in which resonance is off. The state, in which the resonance of the power receiver 100A is turned off, is a state that has no effect on the power receiver 101B measuring an efficiency of electric power reception by receiving electric power from the power transmitter 10.

The power transmitter 10 receives data, which represents the received electric power and the rated output of the battery 220A, transmitted from the power receiver 101A, and detects the rated output and the received electric power of the power receiver 101A in step S116.

Next, the power transmitter 10 transmits, to the power receiver 101B in step S117, a notification of test electric power transmission.

The power receiver 101B determines in step S112B whether a notification of test electric power transmission is received from the power transmitter 10. Note that the power receiver 101B repeatedly executes the process of step S112B until receiving the notification of test electric power transmission from the power transmitter 10.

The power receiver 101B turns off the switches 131X and 131Y of the adjuster 130B and switches the coupling destination of the switch 180B to the dummy resistor 190B in step 113B. Upon turning off the switches 131X and 131Y of the adjuster 130B, the power receiver 101B transitions to a state where a resonance current flows in the secondary-side resonant coil 110B over the period of one cycle of resonance through magnetic resonance. Upon completing the process of step S113B, the power receiver 101B reports the completion to the power transmitter 10.

The power transmitter 10 starts test electric power transmission in step S118. In this way, the power receiver 101B starts to receive the electric power.

The power receiver 101B controls the amount of shift in the phase shift circuit 153 of the controller 150B to adjust the phase of the two clock signals CLK1 and CLK2, and to detect the reference phase in which the maximum efficiency of electric power reception is obtained. The power receiver 101B reports, to the power transmitter 10, a rated output of the battery 220B and the received electric power that represents the electric power received from the power transmitter 10, and turns on the switches 131X and 131Y of the adjuster 130B in step S115B. In this way, the received electric power that the power receiver 101B reports to the power transmitter 10 is measured in the reference phase, and hence, is the maximum received electric power that can be received by the power receiver 101B.

When the switches 131X and 131Y of the adjuster 130B are turned on, the power receiver 101B enters a state in which resonance through magnetic field resonance is not generated even if receiving electric power. That is, it enters a state in which resonance is off.

The power transmitter 10 receives data, which represents the received electric power and the rated output of the battery 220B, transmitted from the power receiver 101B, and detects the rated output and the received electric power of the power receiver 101B in step S119.

The process illustrated in FIG. 21 is completed as described above. Note that (1), (1A), and (1B) of the process illustrated in FIG. 21 respectively lead to (1), (1A), and (1B) illustrated in FIG. 22.

Using the data, which represents the rated output of the battery 220A and the received electric power, received from the power receiver 101A and the data, which represents the rated output of the battery 220B and the received electric power, received from the power receiver 101B, the power transmitter 10 determines phase differences of the driving signals that drive the adjusters 130A and 130B of the power receivers 101A and 101B and reports the phase differences to the power receivers 101A and 101B in step S121. The phase differences may be determined by a method similar to that of the first embodiment.

The power receiver 101A drives in step S122A the adjuster 130A by using the phase difference received from the power transmitter 10. Similarly, the power receiver 101B drives in step S122B the adjuster 130B by using the phase difference received from the power transmitter 10.

The controller 150A of the power receiver 100A detects the reference phase in step S115A before setting the phase difference of the driving signal in step S122A.

The controller 150A sets the phase, obtained by adding the phase difference received from the power transmitter 10 to the reference phase, as the phase of the driving signal (the two clock signals). This is also the same for the controller 150B of the power receiver 100B setting the phase in step S115B.

The power transmitter 10 starts test electric power transmission in step S123. Differing from the test electric power transmission in steps S114 and S118, this test electric power transmission is a test to simultaneously transmit electric power to both the power receiver 101A and the power receiver 101B. In a state of simultaneously receiving electric power, each of the power receivers 101A and 10B measures the received electric power.

The power receiver 101A reports, to the power transmitter 10, the received electric power that represents the electric power received from the power transmitter 10, and turns on the switches 131X and 131Y of the adjuster 130A in step S124A. Similarly, the power receiver 101B reports, to the power transmitter 10, the received electric power that represents the electric power received from the power transmitter 10, and turns on the switches 131X and 131Y of the adjuster 130B in step S124B.

The power transmitter 10 receives data, which represents the received electric power, transmitted from the power receiver 101A and data, which represents the received electric power, transmitted from the power receiver 101B, and thus detects the received electric power of the power receiver 101A and the received electric power of the power receiver 101B in step S125.

The power transmitter 10 determines whether the received electric power of the power receiver 101A and the received electric power of the power receiver 101B received in step S125 are within respective target ranges in step S126.

Here, for example, electric power of 50% of the rated output of the power receiver 101A and electric power of 50% of the rated output of the power receiver 101B are respectively set as lower limit values of the target ranges of received electric power, and electric power of 130% of the rated output of the power receiver 101A and electric power of 130% of the rated output of the power receiver 101B are respectively set as upper limit values of the target ranges of received electric power.

Such target ranges of received electric power may be set, by the controller 15 of the power transmitter 10, based on the rated outputs of the batteries 220A and 220B received from the power receivers 101A and 101B in steps S116 and S119. Such target ranges of received electric power are used to enhance the balance of received electric power of the power receivers 101A and 101B.

Upon determining in step S126 that the ratio of the received electric power is not within the target range (NO in step S126), the power transmitter 10 causes the flow to return to step S121. This is in order to adjust the phase difference(s) again to confirm whether the efficiency of electric power reception is within the target range. Note that when returning to step S121 to reset the phase differences, among the power receivers 101A and 101B, the power transmitter 10 may decrease the absolute value of the phase difference of the power receiver of which the received electric power is less than or equal to the lower limit of the target range and increase the absolute value of the phase difference of the power receiver of which the received electric power is greater than or equal to the upper limit of the target range.

The process illustrated in FIG. 22 is completed as described above. Note that (2), (2A), and (2B) of the process illustrated in FIG. 22 respectively lead to (2), (2A), and (2B) illustrated in FIG. 23.

Upon determining that the received electric power is within the target range (YES in step S126), the power transmitter 10 transmits, to each of the power receivers 101A and 101B in step S131, a notification of actual electric power transmission that represents actual electric power transmission is to be performed. Differing from the test electric power transmission, the actual electric power transmission is to transmit electric power in order to actually charge the power receivers 101A and 101B. The notification of actual electric power transmission means a notification, which is reported from the power transmitter 10 to the power receivers 101A and 101B, that the actual electric power transmission is to be performed.

The power receiver 101A determines in step S132A whether a notification of actual electric power transmission is received from the power transmitter 10. Similarly, the power receiver 101B determines in step S132B whether a notification of actual electric power transmission is received from the power transmitter 10.

Note that in a case of not receiving the notification of actual electric power transmission, the respective power receivers 101A and 101B cause the flow to return to steps S122A and S122B. Because this corresponds to a case, in which it is determined by the power transmitter 10 that the received electric power is not within the target range in step S126, the power transmitter 10 returns to step S121 for transmitting to the power receivers 101A and 101B the phase differences used to drive the adjusters 130A and 130B.

Upon determining that the notification of actual electric power transmission is received from the power transmitter 10 (YES in step S132A), the power receiver 101A restarts to drive the adjuster 130A by using the phase difference, switches the coupling destination of the switch 180A to the battery 220A, and reports to the power transmitter 10 the switching of the coupling destination in step S133A. Similarly, upon determining that the notification of actual electric power transmission is received from the power transmitter 10 (YES in step S132B), the power receiver 101B restarts to drive the adjuster 130B by using the phase difference, switches the coupling destination of the switch 180B to the battery 220B, and reports to the power transmitter 10 the switching of the coupling destination in step S133B.

The power transmitter 10 starts the actual electric power transmission in step S134.

The power receiver 101A determines in step S135A whether the battery 220A has been fully charged or whether an operation of stopping the charging has been performed by a user. Similarly, the power receiver 101B determines in step S135B whether the battery 220B has been fully charged or whether an operation of stopping the charging has been performed by a user.

Upon determining neither a full charge nor an operation of stopping the charging (NO in step S135A), the power receiver 101A determines in step S136A whether it is required to readjust the phase difference.

For example, in a case where the power receiver 101B becomes fully charged or enters a state of not being charged due to the operation of stopping the charging, it is required to readjust the phase difference of the power receiver 101A. Accordingly, the power receiver 101A determines that it is required to readjust the phase difference, in a case where the power transmitter 10 determines in step S139 that will be described later below that the charging of the power receiver 101B is completed or the charging is stopped, and the power receiver 101A receives, from the power transmitter 10, a notification of the completion of the charging of the power receiver 101B or of the stopping of the charging.

Upon determining neither a full charge nor an operation of stopping the charging (NO in step S135B), the power receiver 101B determines in step S136B whether it is required to readjust the phase difference.

For example, in a case where the power receiver 101A becomes fully charged or enters a state of not being charged due to the operation of stopping the charging, it is required to readjust the phase difference of the power receiver 101B. Accordingly, the power receiver 101B determines that it is required to readjust the phase difference, in a case where the power transmitter 10 determines in step S139 that will be described later below that the charging of the power receiver 101A is completed or the charging is stopped, and the power receiver 101B receives, from the power transmitter 10, a notification of the completion of the charging of the power receiver 101A or of the stopping of the charging.

Upon determining that the battery 220A is fully charged or the operation of stopping the charging is performed (YES in step S135A), the power receiver 101A reports, to the power transmitter 10, the charging completion or the occurrence of the stopping operation. In this way, the power receiver 101A completes the process.

Similarly, upon determining that the battery 220B is fully charged or the operation of stopping the charging is performed (YES in step S135B), the power receiver 101B reports, to the power transmitter 10, the charging completion or the occurrence of the stopping operation. In this way, the power receiver 101B completes the process.

The power transmitter 10 determines in step S137 whether the charging is completed or the stopping operation is performed in the power receiver 101A or 101B. The power transmitter 10 makes the determination of step S137 based on presence/absence of the notification, which represents the charging completion or the stopping operation, from the power receiver 101A or 101B. Note that the determination of step S137 is repeatedly executed until the notification, which represents the charging completion or the stopping operation, is received from the power receiver 101A or 101B.

Upon reporting to the power transmitter 10 that the battery 220A is fully charged or the operation of stopping the charging is performed, the power receiver 101A turns on the switches 131X and 131Y of the adjuster 130A in step S138A. Thereby, the power receiver 101A transitions to a state of not receiving electric power. Similarly, upon reporting to the power transmitter 10 that the battery 220B is fully charged or the operation of stopping the charging is performed, the power receiver 101B turns on the switches 131X and 131Y of the adjuster 130B in step S138B. Thereby, the power receiver 101B transitions to a state of not receiving electric power.

Upon determining that the notification, which represents the charging completion or the stopping operation, is received from the power receiver 101A or 101B (YES in step S137), the power transmitter 10 determines in step S139 whether the charging is completed or the charging is stopped for both of the power receivers 101A and 101B. This is because it is required to continue to transmit the electric power if the charging of one of the power receivers 101A and 101 is not completed or not stopped.

Upon determining that charging of one of the power receivers 101A and 101B is not completed or not stopped, (NO in step S139), the power transmitter 10 causes the flow to return to step S121. This is in order to again set the phase differences(s) and to transmit the electric power.

Upon determining that the charging of the power receiver 101A is completed or the charging is stopped, the power transmitter 10 reports, to the power receiver 101B, that the charging of the power receiver 101A is completed or the charging is stopped. Similarly, upon determining that the charging of the power receiver 101B is completed or the charging is stopped, the power transmitter 10 reports, to the power receiver 101A, that the charging of the power receiver 101B is completed or the charging is stopped.

Upon determining that the charging is completed or the charging is stopped in both of the power receivers 101A and 101B (YES in step S139), the power transmitter 10 completes the process.

As described above, the process of transmitting the electric power to the power receivers 101A and 101B by the power transmitter 10 is completed.

Note that although it has been described in the above embodiment that the phase differences are determined in the case where the two power receivers 101A and 101B receive the electric power from the power transmitter 10, phase differences may be similarly determined in a case where three or more power receivers receive electric power from the power transmitter 10. For example, in a case where three power receivers are present, after completion of step S115B, steps equivalent to steps S111, S112A, S113A, S114, S115A, and S116 are performed for the third power receiver. Thereby, the power transmitter 10 may obtain a rated output and received electric power of the third power receiver.

Then, after the phase difference of the third power receiver is determined and it is determined whether the received electric power is within the target range, actual electric power transmission may be performed. The above process is similarly performed in a case where four or more power receivers are present.

As described above, according to the second embodiment, it is possible to provide the power receiver 101A or 101B that can improve the balance of supplied amounts of electric power. Further, according to the second embodiment, it is possible to provide a power transmitting system that can improve the balance of supply amounts of electric power.

Further, according to the second embodiment, the process of test electric power transmission through steps S121 to S126 are performed when the phase differences of the power receivers 101A and 101B are determined. Then, as a result of the test electric power transmission, when the received electric power of the power receivers 101A and 101B is not within the target range, the phase differences are readjusted to obtain the phase differences that can further improve the balance of electric power reception.

Therefore, according to the second embodiment, it is possible to provide the power receiver 101A or 101B that further improves the balance of supplied amounts of electric power.

Third Embodiment

Figure 24:
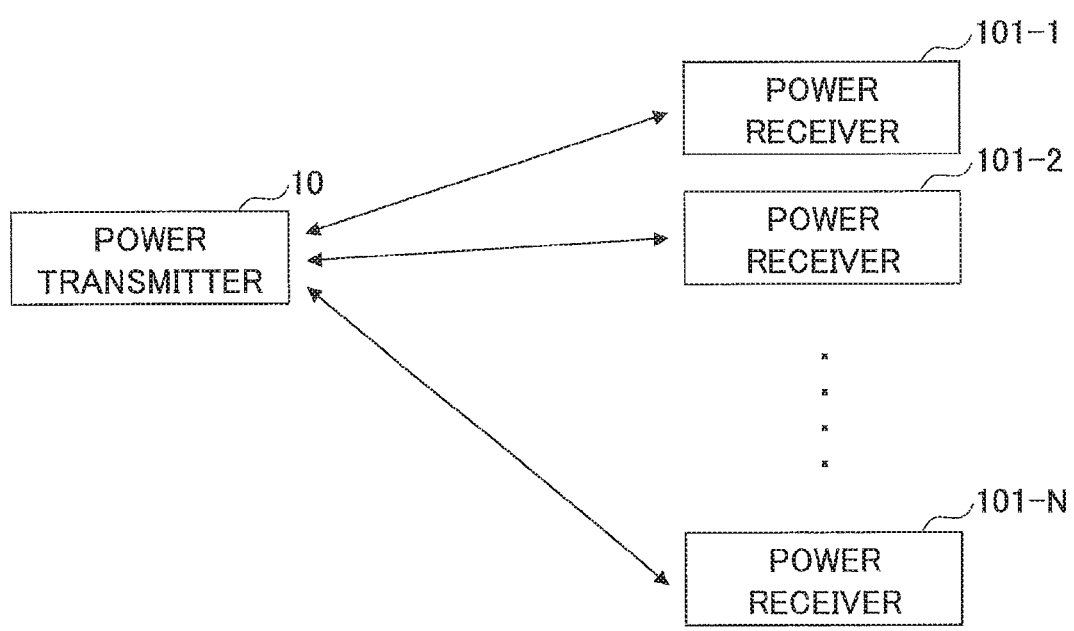
FIG. 24 is a diagram illustrating the power transmitter 10 and N power receivers 101-1, 101-2, . . . , and 101-N according to a third embodiment.
Figure 25:
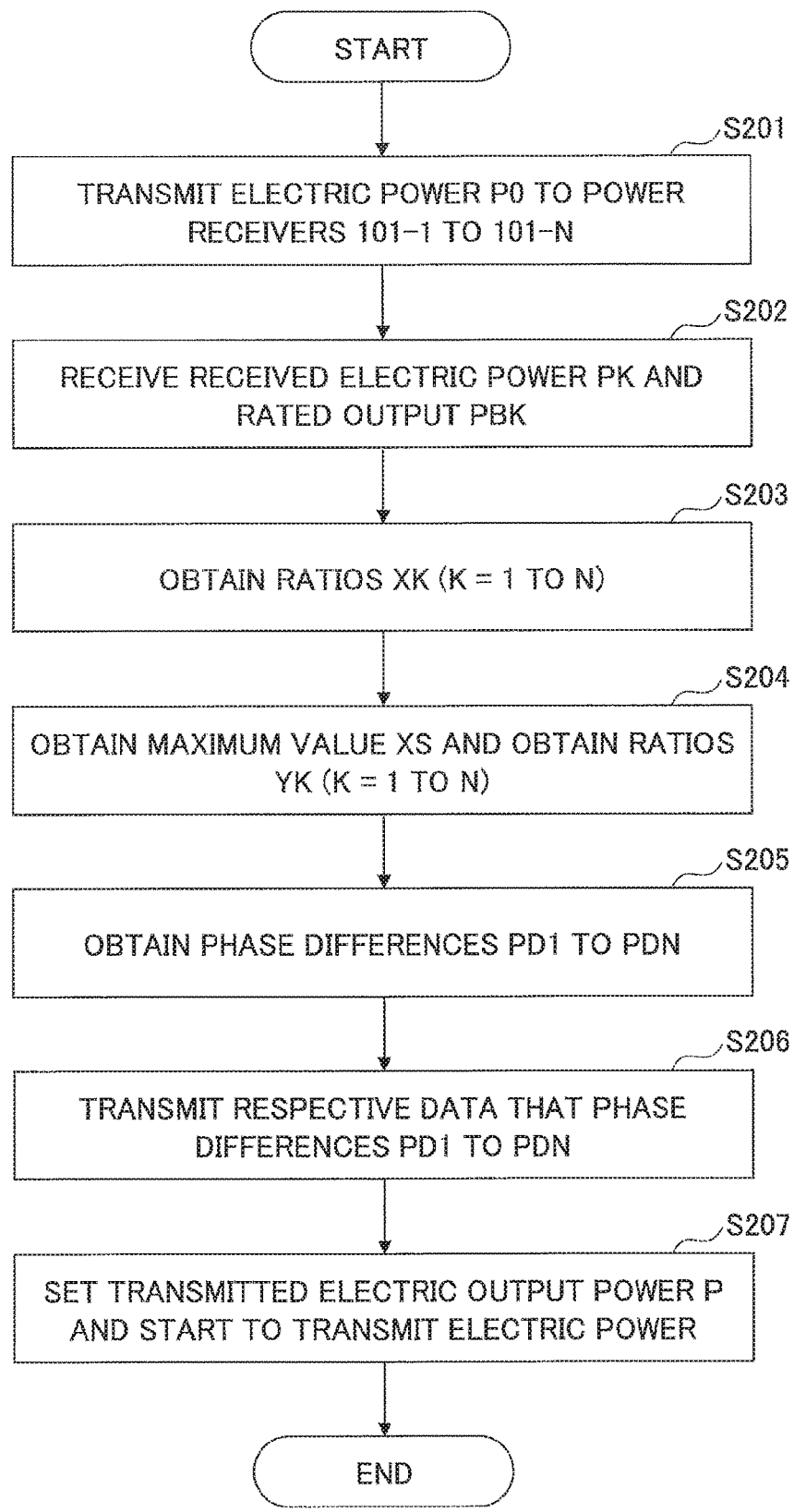
FIG. 25 is a flowchart illustrating processing of determining phase differences and transmitted electric output power P according to the third embodiment.

FIG. 24 is a diagram illustrating the power transmitter 10 and N power receivers 101-1, 101-2, . . . , and 101-N according to a third embodiment. FIG. 25 is a flowchart illustrating a process of determining phase differences and transmitted electric output power P according to the third embodiment. FIG. 26 is a diagram illustrating tabular data used in the third embodiment.

In the third embodiment, a method will be described of determining phase differences of driving signals that drive the adjusters 130 of the power receivers 101-1 to 101-N when electric power is transmitted from the single power transmitter 10 to the N power receivers 101-1, 101-2, . . . , and 101-N.

Here, N is any integer number, and may be an integer number equal to or greater than 2.

Each of the power receivers 101-1 to 101-N has a configuration equivalent to that of the power receivers 101A and 101B of the second embodiment. Further, it is assumed in the following description that DC-DC converters 210B and batteries 220B are coupled to the respective power receivers 101-1 to 101-N.

In the following, data that represents received electric power, a phase difference or the like is communicated between the controller 15 of the power transmitter 10 and the controllers 150 of the power receivers 101-1 to 101-N. The communications between the controllers 150 and the controller 15 are performed between the antennas 170 the antenna 16 (see FIG. 10).

Specifically, according to the third embodiment, phase differences of driving signals that drive the adjusters 130 included in the respective power receivers 101-1 to 101-N are determined in a procedure as follows.

First, the power transmitter 10 individually transmits, to each of the power receivers 101-1 to 101-N, electric power P0 in step S201. Upon receiving the electric power P0, each of the power receivers 101-1 to 101-N transmits, to the power transmitter 10, data, which represents a rated output PBK (K=1 to N) of the battery 220 and received electric power PK (K=1 to N).

Next, the power transmitter 10 receives the data that represents the rated output PBK (K=1 to N) of the battery 220 and the received electric power PK (K=1 to N) in step S202.

The received electric power PK is measured, inside of each of the power receivers 101-1 to 101-N, by coupling the switch 180 to the dummy resistor 190. The rated outputs PBK are the rated outputs of the batteries 220 coupled to the respective power receivers 101-1 to 101-N. Each of the controllers 150 of the power receivers 101-1 to 101-N stores the data that represents the rated output of the battery 220 in an internal memory.

The power transmitter 10 transmits the electric power N times because the power transmitter 10 transmits the electric power to each of the power receivers 101-1 to 101-N on a one-to-one basis. Note that the electric power P0, which the power transmitter 10 transmits to each of the power receivers 101-1 to 101-N, is equal with respect to each of the power receivers 101-1 to 101-N.

Next, the power transmitter 10 calculates, with respect to each of the power receivers 101-1 to 101-N, a ratio XK (K=1 to N) of the rated output PBK (K=1 to N) with respect to the received electric power (K=1 to N) in step S203. Here, the ratio XK is obtained by a formula of XK=PBK/PK.

Next, the power transmitter 10 obtains the maximum value XS among the ratios XK, and calculates, with respect to the respective power receivers 101-1 to 101-N, ratios YK (K=1 to N) of the ratios XK with respect to the maximum value XS in step S204. Here, the ratio YK is obtained by a formula of YK=XK/XS.

Next, the power transmitter 10 obtains phase differences PD1 to PDN that enable the respective received electric power of the power receivers 101-1 to 101-N to be Y1-fold to YN-fold in step S205. For example, tabular data as illustrated in FIG. 26 may be used to obtain the phase differences PD1 to PDN that enable the respective received electric power to be Y1-fold to YN-fold.

The tabular data illustrated in FIG. 26 is data that associates combinations of the ratios Y1 to YN with combinations of the phase differences PD1 to PDN. There are Ya1, Ya2, ..., and YaN, Yb1, Yb2, ..., and YbN, and the like for the combinations of the ratios Y1 to YN. There are PDa1, PDa2, and PDaN, PDb1, PDb2, ..., and PDbN, and the like for the combinations of values of the phase differences PD1 to PDN.

Ya1, Ya2, ..., and YaN in the combination of the ratios Y1 to YN are respectively associated with PDa1, PDa2, ..., and PDaN in the combination of the phase differences PD1 to PDN. Yb1, Yb2, ..., and YbN in the combination of the ratios Y1 to YN are respectively associated with PDb1, PDb2, ..., and PDbN in the combination of the phase differences PD1 to PDN.

Numerous data, which associate such combinations of the ratios Y1 to YN with such combinations of the phase differences PD1 to PDN, may be prepared so that the phase differences PD1 to PDN, which correspond to the ratios Y1 to YN obtained for the power receivers 101-1 to 101-N in step S204, may be obtained from the tabular data illustrated in FIG. 26.

Note that in a case where the combination of the ratios Y1 to YN obtained for the power receivers 101-1 to 101-N in step S204 is not included in the tabular data illustrated in FIG. 26, phase differences PD1 to PDN, associated with ratios Y1 to YN close to the ratios Y1 to YN obtained in step S204, may be used. In the case where the combination of the ratios Y1 to YN obtained in step S204 is not included in the tabular data illustrated in FIG. 26, the phase differences PD1 to PDN, obtained through interpolating a process or the like for obtaining ratios Y1 to YN close to the ratios Y1 to YN of the combination obtained in step S204, may be used.

Here, the embodiment has been described in which the phase differences PD1 to PDN are obtained by using the tabular data illustrated in FIG. 26. However, the phase differences PD1 to PDN may be calculated in accordance with the values of the ratios Y1 to YN, for example. The values of the ratios Y1 to YN are 1 in a case where the ratio XK is the maximum value XS, and are values less than 1 in other cases. Thus, a required amount of received electric power increases as the values of the ratios Y1 to YN increase. Therefore, the phase differences PD1 to PDN may be set to be values closer to 0 degrees as the values of the ratios Y1 to YN increase, and the phase differences PD1 to PDN may be set to be values farther away from 0 degrees as the values of the ratios Y1 to YN decrease.

Next, the power transmitter 10 transmits the respective data that represent the phase differences PD1 to PDN to the power receivers 101-1 to 101-N in step S206.

Finally, the power transmitter 10 sets transmitted electric output power P by the following formula (3) in step S207.

$$P = \sum_{K=1}^{N} XK \times PK \qquad (3)$$

As described above, setting the phase differences PD1 to PDN and transmitted electric output power P is thus completed.

As described above, according to the third embodiment, it is possible to provide the power receivers 101-1 to 101-N that can improve the balance of supplied amounts of electric power. Further, according to the third embodiment, it is possible to provide the power transmitting system (the power receivers 101-1 to 101-N and the power transmitter 10) that can improve the balance of supply amounts of electric power.

Although examples of the power receivers and the power transmitting systems according to the embodiments of the present invention have been described above, the present invention is not limited to the embodiments specifically disclosed and various variations and modifications may be made without departing from the scope of the present invention.

All examples and conditional language provided herein are intended for pedagogical purposes of aiding the reader in understanding the invention and the concepts contributed by the inventors to further the art, and are not to be construed as limitation to such specifically recited examples and conditions, nor does the organization of such examples in the specification relate to a showing of superiority and inferiority of the invention. Although one or more embodiments of the present invention have been described in detail, it should be understood that various changes, substitutions, and alterations could be made hereto without departing from the spirit and scope of the invention.

What is claimed is:

1. A power receiver comprising:
    a secondary-side resonant coil part and configured to receive electric power from a primary-side resonant coil through magnetic field resonance generated between the primary-side resonant coil and the secondary-side resonant coil;
    a first capacitor inserted in series in the resonant coil part of the secondary-side resonant coil;
    a series circuit, coupled in parallel with the first capacitor, of a first switch and a second switch;
    a first rectifier coupled in parallel with the first switch, the first rectifier having a first rectification direction;
    a second rectifier coupled in parallel with the second switch, the second rectifier having a second rectification direction opposite to the first rectification direction;
    a second capacitor inserted in series with the series circuit;
    a detector configured to detect a voltage waveform or a current waveform of the electric power supplied to the secondary-side resonant coil; and
    a controller configured to adjust a phase difference between the voltage waveform or the current waveform detected by the detector and a driving signal that includes a first signal for switching on/off the first switch and includes a second signal for switching on/off the second switch to adjust an amount of the electric power received by the secondary-side resonant coil.

2. The power receiver according to claim 1, wherein the second capacitor is inserted in series between the resonant coil part and the first switch or between the first switch and the second switch.

3. The power receiver according to claim 1, wherein the second capacitor is inserted in series between the first switch and the second switch or between the second switch and the resonant coil part.

4. The power receiver according to claim 1,
    wherein a first driving range, in which a phase of the driving signal, including the first signal and the second signal, is delayed with respect to a phase of the voltage waveform or the current waveform, differs from a second driving range, in which the phase of the driving signal, including the first signal and the second signal, is advanced with respect to the phase of the voltage waveform or the current waveform, in efficiency of electric power reception of the secondary-side resonant coil with respect to the phase difference, and
    wherein the controller adjusts the phase difference in the first driving range to adjust the amount of the electric power received by the secondary-side resonant coil, a difference between a maximum value of the efficiency of electric power reception and a minimum value of the efficiency of electric power reception in the first driving range being greater than a difference between a maximum value of the efficiency of electric power reception and a minimum value of the efficiency of electric power reception in the second driving range.

5. The power receiver according to claim 1, wherein the controller adjusts the phase difference to adjust a ratio of a state, where resonance does not occur in the resonant coil part, to a state, where resonance occurs in the resonant coil part, to adjust the amount of the electric power received by the secondary-side resonant coil.

6. The power receiver according to claim 1,
    wherein the secondary-side resonant coil further includes a first terminal and a second terminal provided at both ends of the resonant coil part, respectively,
    wherein the first rectifier and the second rectifier respectively have a first current input terminal and a second current input terminal, and the first rectifier and the second rectifier are respectively coupled in parallel with the first switch and the second switch in a state where the first current input terminal and the second current input terminal are coupled, and
    wherein the controller turns off the first switch and turns on the second switch when an electric current flows in the resonant coil part from the first terminal to the second terminal, and turns on the first switch and turns off the second switch when an electric current flows in the resonant coil part from the second terminal to the first terminal, to generate resonance in the resonant coil part through the magnetic field resonance.

7. The power receiver according to claim 6, wherein the controller turns on the first switch and turns off or on the second switch when an electric current flows in the resonant coil part from the first terminal to the second terminal, and turns off or on the first switch and turns on the second switch when an electric current flows in the resonant coil part from the second terminal to the first terminal, to generate a state where resonance does not occur in the resonant coil part through the magnetic resonance.

8. The power receiver according to claim 1, further comprising:
    a communication part configured to receive a voltage waveform or a current waveform of electric power supplied to the primary-side resonant coil,
    wherein the detector detects the voltage waveform or the current waveform of the electric power supplied to the secondary-side resonant coil, based on the voltage waveform or the current waveform of the electric power supplied to the primary-side resonant coil received by the communication part.

9. The power receiver according to claim 1, wherein the detector detects the voltage waveform or the current waveform of the electric power supplied to the secondary-side resonant coil.

10. The power receiver according to claim 1,
    wherein the secondary-side resonant coil further includes a first terminal and a second terminal provided at both ends of the resonant coil part, respectively,
    wherein the first rectifier and the second rectifier respectively have a first current output terminal and a second current output terminal, and the first rectifier and the second rectifier are respectively coupled in parallel with the first switch and the second switch in a state where the first current output terminal and the second current output terminal are coupled, and wherein the controller turns on the first switch and turns off the second switch when an electric current flows in the resonant coil part from the first terminal to the second terminal, and turns off the first switch and turns on the second switch when an electric current flows in the resonant coil part from the second terminal to the first terminal, to generate resonance in the resonant coil part through the magnetic resonance.

11. The power receiver according to claim 10, wherein the controller turns off or on the first switch and turns on the second switch when an electric current flows in the resonant coil part from the first terminal to the second terminal, and turns on the first switch and turns off or on the second switch when an electric current flows in the resonant coil part from the second terminal to the first terminal, to generate a state where resonance does not occur in the resonant coil part through the magnetic resonance.

12. The power receiver according to claim 1, further comprising:
- a rectifier circuit coupled to a first terminal and a second terminal of the secondary-side resonant coil and configured to rectify AC power input from the secondary-side resonant coil;
- a smoothing circuit coupled to an output side of the rectifier circuit; and
- a pair of output terminals coupled to an output side of the smoothing circuit.

* * * * *